(12) United States Patent
Arnouse

(10) Patent No.: US 11,113,228 B2
(45) Date of Patent: *Sep. 7, 2021

(54) PORTABLE COMPUTING SYSTEM AND PORTABLE COMPUTER FOR USE WITH SAME

(71) Applicant: Arnouse Digital Devices Corporation

(72) Inventor: Michael Arnouse, Old Brookville, NY (US)

(73) Assignee: Arnouse Digital Devices Corporation, Greenvale, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/440,732

(22) Filed: Jun. 13, 2019

(65) Prior Publication Data

US 2019/0294578 A1 Sep. 26, 2019

Related U.S. Application Data

(63) Continuation of application No. 16/185,092, filed on Nov. 9, 2018, now Pat. No. 10,628,368, which is a (Continued)

(51) Int. Cl.
*G06F 13/40* (2006.01)
*H05K 7/20* (2006.01)
(Continued)

(52) U.S. Cl.
CPC ........ *G06F 13/4081* (2013.01); *G06F 1/1628* (2013.01); *G06F 1/1632* (2013.01);
(Continued)

(58) Field of Classification Search
CPC ...... G06F 21/602; G06F 15/177; G06F 21/34; H04L 63/08; H04L 63/0853
(Continued)

(56) References Cited

U.S. PATENT DOCUMENTS 4,800,590 A * 1/1989 Vaughan ................. G06F 21/34
235/382
4,890,832 A 1/1990 Komaki
(Continued)

FOREIGN PATENT DOCUMENTS

CN 1297288 A 5/2001
CN 102007467 A 4/2011
(Continued)

OTHER PUBLICATIONS

Tyson et al., "How RAM Works", Copyright 2019, Howstuffworks.com, retrieved from the Internet on Nov. 4, 2019 at <https://computer.howstuffworks.com/ram.htm/printable>.*

(Continued)

*Primary Examiner* — Faisal M Zaman
(74) *Attorney, Agent, or Firm* — DLA Piper LLP (US)

(57) ABSTRACT

A computing system comprising a portable computer and a reader are disclosed. The portable computer is pocket-sized and comprises flash memory, and optionally a processor and a GPS chip. The reader includes a monitor, a keyboard with docking port and an optional processor and at least one input/output USB connector. A user cannot interact with the portable computer without the reader. The reader is a non-functioning "shell" without the portable computer, however, when they are connected the system becomes a fully functional personal computer. To log on, a user provides security information, for example, a password or biometrics, such as fingerprints. The credit card size and capabilities of the portable computer allows a user to easily carry virtually their entire computer in a pocket for use anywhere there is a reader. In addition, the portable computer provides security against unauthorized use, even if lost or stolen.

20 Claims, 19 Drawing Sheets

Related U.S. Application Data continuation of application No. 15/466,236, filed on Mar. 22, 2017, now Pat. No. 10,235,323, which is a continuation-in-part of application No. 14/845,405, filed on Sep. 4, 2015, now Pat. No. 10,638,635, which is a continuation of application No. 14/507,408, filed on Oct. 6, 2014, now Pat. No. 9,141,139, which is a continuation-in-part of application No. 13/404,787, filed on Feb. 24, 2012, now Pat. No. 9,010,623, which is a continuation of application No. 12/402,712, filed on Mar. 12, 2009, now Pat. No. 9,010,645, which is a continuation-in-part of application No. 12/099,000, filed on Apr. 7, 2008, now Pat. No. 7,533,408, and application No. 15/466,236, which is a continuation-in-part of application No. 12/099,032, filed on Apr. 7, 2008, now Pat. No. 7,516,484.

(60) Provisional application No. 61/028,373, filed on Feb. 13, 2008.

(51) Int. Cl.
   *H05K 7/14* (2006.01)
   *G06F 1/16* (2006.01)
   *G06F 11/14* (2006.01)
   *G06F 11/20* (2006.01)

(52) U.S. Cl.
   CPC ...... *G06F 11/1423* (2013.01); *G06F 11/2023* (2013.01); *H05K 7/1488* (2013.01); *H05K 7/20709* (2013.01); *H05K 7/20736* (2013.01); *Y02D 10/00* (2018.01)

(58) Field of Classification Search
   USPC .......................................... 710/72, 303, 304
   See application file for complete search history.

(56) References Cited

U.S. PATENT DOCUMENTS

| | | | |
|---|---|---|---|
| 5,264,992 A | 11/1993 | Hogdahl et al. | |
| 5,305,183 A | 4/1994 | Teynor | |
| 5,313,596 A | 5/1994 | Swindler et al. | |
| 5,347,425 A | 9/1994 | Herron et al. | |
| 5,367,766 A | 11/1994 | Burns et al. | |
| 5,436,857 A * | 7/1995 | Nelson | G06F 1/1616 708/140 |
| 5,442,512 A | 8/1995 | Bradbury | |
| 5,452,177 A * | 9/1995 | Frutiger | H01L 21/6831 279/128 |
| 5,463,742 A * | 10/1995 | Kobayashi | G06F 1/1632 361/679.41 |
| 5,488,572 A | 1/1996 | Belmont | |
| 5,574,309 A | 11/1996 | Papapietro et al. | |
| 5,590,022 A | 12/1996 | Harvey | |
| 5,594,952 A * | 1/1997 | Virtuoso | H04B 1/38 375/222 |
| 5,608,608 A | 3/1997 | Flint et al. | |
| 5,628,055 A * | 5/1997 | Stein | H04B 1/38 455/575.1 |
| 5,630,159 A | 5/1997 | Zancho | |
| 5,677,521 A | 10/1997 | Garrou | |
| 5,708,840 A | 1/1998 | Kikinis et al. | |
| 5,748,737 A | 5/1998 | Daggar | |
| 5,770,478 A * | 6/1998 | Iruvanti | H01L 21/4878 257/E23.103 |
| 5,887,145 A | 3/1999 | Harari et al. | |
| 5,890,016 A | 3/1999 | Tso | |
| 5,912,809 A | 6/1999 | Steigerwald et al. | |
| 5,991,838 A | 11/1999 | Swindler et al. | |
| 6,005,769 A * | 12/1999 | Cho | G06F 1/1632 361/679.41 |
| 6,029,183 A * | 2/2000 | Jenkins | G06F 1/16 708/100 |
| 6,029,215 A | 2/2000 | Watts, Jr. et al. | |
| 6,035,359 A | 3/2000 | Enoki | |
| 6,052,276 A | 4/2000 | Do et al. | |
| 6,072,233 A * | 6/2000 | Corisis | H01L 23/3107 257/685 |
| 6,097,605 A | 8/2000 | Klatt et al. | |
| 6,098,131 A | 8/2000 | Unger et al. | |
| 6,216,185 B1 | 4/2001 | Chu | |
| 6,243,578 B1 * | 6/2001 | Koike | H04B 1/38 455/552.1 |
| 6,267,673 B1 | 7/2001 | Miyamoto et al. | |
| 6,304,445 B1 * | 10/2001 | Bollesen | H01L 23/467 165/80.3 |
| 6,317,544 B1 | 11/2001 | Diehl et al. | |
| 6,335,868 B1 | 1/2002 | Butterbaugh et al. | |
| 6,353,870 B1 | 3/2002 | Mills et al. | |
| 6,438,577 B1 | 8/2002 | Owens | |
| 6,493,020 B1 | 12/2002 | Stevenson et al. | |
| 6,532,152 B1 * | 3/2003 | White | G02F 1/133308 361/692 |
| 6,538,880 B1 | 3/2003 | Kamijo et al. | |
| 6,538,982 B1 | 3/2003 | Van Vlerken et al. | |
| 6,621,708 B1 | 9/2003 | Sparkes et al. | |
| 6,621,709 B1 | 9/2003 | Schnabel et al. | |
| 6,636,918 B1 | 10/2003 | Aguilar et al. | |
| 6,668,318 B1 | 12/2003 | Jenkins et al. | |
| 6,701,231 B1 | 3/2004 | Borugian | |
| 6,710,443 B1 * | 3/2004 | Rost | H01L 23/367 257/181 |
| 6,718,415 B1 | 4/2004 | Chu | |
| 6,747,878 B1 | 6/2004 | Hipp et al. | |
| 6,826,456 B1 | 11/2004 | Irving et al. | |
| 6,867,966 B2 | 3/2005 | Smith et al. | |
| 6,898,283 B2 * | 5/2005 | Wycherley | H04B 1/401 379/428.01 |
| 6,934,786 B2 | 8/2005 | Irving et al. | |
| 6,957,291 B2 | 10/2005 | Moon et al. | |
| 6,999,792 B2 * | 2/2006 | Warren | G06F 1/1616 343/702 |
| 7,024,700 B1 * | 4/2006 | Horikoshi | G06F 21/88 726/34 |
| 7,042,720 B1 | 5/2006 | Konshak et al. | |
| 7,072,179 B1 * | 7/2006 | Curran | G06F 1/16 165/104.32 |
| 7,120,462 B2 | 10/2006 | Kumar | |
| 7,167,359 B2 | 1/2007 | Wendel et al. | |
| 7,312,999 B1 | 12/2007 | Miyamura et al. | |
| 7,328,333 B2 | 2/2008 | Kawano et al. | |
| 7,346,689 B1 | 3/2008 | Northcutt et al. | |
| 7,355,852 B2 | 4/2008 | Pfahnl | |
| 7,370,350 B1 | 5/2008 | Salowey | |
| 7,383,982 B2 | 6/2008 | Yamamoto et al. | |
| 7,400,510 B1 | 7/2008 | Milligan et al. | |
| 7,477,919 B2 | 1/2009 | Warren | |
| 7,515,471 B2 | 4/2009 | Oh et al. | |
| 7,516,484 B1 | 4/2009 | Arnouse | |
| 7,533,408 B1 * | 5/2009 | Arnouse | G06F 1/16 726/9 |
| 7,593,723 B2 * | 9/2009 | Zarom | G06F 1/1615 455/41.2 |
| 7,609,512 B2 | 10/2009 | Richardson et al. | |
| 7,647,491 B2 | 1/2010 | Kawano et al. | |
| 7,660,603 B2 | 2/2010 | Noguchi et al. | |
| 7,843,692 B2 | 11/2010 | Everhart et al. | |
| 7,859,856 B2 | 12/2010 | Lanning | |
| 7,916,487 B2 | 3/2011 | Bitton et al. | |
| 8,105,108 B2 | 1/2012 | Vroom et al. | |
| 8,498,113 B2 | 7/2013 | Tran et al. | |
| 8,543,069 B2 | 9/2013 | Kari et al. | |
| 9,642,290 B2 | 5/2017 | Anderson et al. | |
| 9,977,481 B2 | 5/2018 | Achillopoulos | |
| 10,235,323 B2 * | 3/2019 | Arnouse | G06F 13/4081 |
| 2001/0000405 A1 | 4/2001 | Gray et al. | |
| 2001/0019343 A1 | 9/2001 | Walker et al. | |
| 2001/0034250 A1 | 10/2001 | Chadha | |
| 2001/0043513 A1 | 11/2001 | Grupp | |

(56) References Cited

U.S. PATENT DOCUMENTS

| | | |
|---|---|---|
| 2002/0074413 A1 | 6/2002 | Henzerling |
| 2002/0087868 A1* | 7/2002 | King .................. H04L 29/12839 |
| | | 713/185 |
| 2002/0097555 A1 | 7/2002 | Smith et al. |
| 2002/0100810 A1 | 8/2002 | Amadeo |
| 2002/0146662 A1 | 10/2002 | Radl et al. |
| 2002/0146862 A1 | 10/2002 | Wark |
| 2002/0153414 A1 | 10/2002 | Stoutenburg et al. |
| 2002/0173344 A1* | 11/2002 | Cupps ................... G06F 1/1626 |
| | | 455/566 |
| 2002/0188854 A1 | 12/2002 | Heaven et al. |
| 2003/0012485 A1 | 1/2003 | Neeley et al. |
| 2003/0020173 A1* | 1/2003 | Huff ........................ H01P 1/184 |
| | | 257/774 |
| 2003/0033460 A1 | 2/2003 | King et al. |
| 2003/0042316 A1 | 3/2003 | Teraura |
| 2003/0078749 A1 | 4/2003 | Eberle et al. |
| 2003/0084288 A1* | 5/2003 | de Jong .................. G06F 21/33 |
| | | 713/168 |
| 2003/0150915 A1 | 8/2003 | Reece |
| 2003/0154317 A1* | 8/2003 | Ishibashi ............ H04N 21/4147 |
| | | 709/253 |
| 2003/0178495 A1 | 9/2003 | Jones et al. |
| 2003/0198015 A1 | 10/2003 | Vogt |
| 2003/0212832 A1 | 11/2003 | Takahashi et al. |
| 2003/0212862 A1 | 11/2003 | James |
| 2003/0236821 A1 | 12/2003 | Jiau |
| 2004/0003150 A1* | 1/2004 | Deguchi .......... G06K 19/07732 |
| | | 710/62 |
| 2004/0032722 A1 | 2/2004 | Wrycraft et al. |
| 2004/0052041 A1 | 3/2004 | Yair et al. |
| 2004/0102230 A1 | 5/2004 | Nuovo |
| 2004/0109563 A1 | 6/2004 | Evans et al. |
| 2004/0122888 A1 | 6/2004 | Carmichael |
| 2004/0123604 A1 | 7/2004 | Pokharna et al. |
| 2004/0157474 A1 | 8/2004 | Rapaich |
| 2004/0214641 A1 | 10/2004 | Giobbi |
| 2004/0233617 A1* | 11/2004 | Martin .................. H05K 7/1431 |
| | | 361/600 |
| 2004/0249990 A1 | 12/2004 | Yin |
| 2004/0255081 A1 | 12/2004 | Arnouse |
| 2005/0007835 A1 | 1/2005 | Lee et al. |
| 2005/0050325 A1* | 3/2005 | Ohkubo ................... G06F 21/31 |
| | | 713/168 |
| 2005/0083658 A1* | 4/2005 | Huang .................... F28D 20/02 |
| | | 361/700 |
| 2005/0111182 A1* | 5/2005 | Lin ........................ G06F 1/1632 |
| | | 361/679.41 |
| 2005/0129385 A1 | 6/2005 | Speasl et al. |
| 2005/0169467 A1 | 8/2005 | Risan et al. |
| 2005/0270731 A1 | 12/2005 | Yin |
| 2006/0036895 A1* | 2/2006 | Henrickson ......... G06F 11/1451 |
| | | 714/4.11 |
| 2006/0060101 A1 | 3/2006 | Nasser |
| 2006/0067054 A1 | 3/2006 | Wang et al. |
| 2006/0075342 A1 | 4/2006 | Penning |
| 2006/0094419 A1* | 5/2006 | Katou .................. G06F 11/1464 |
| | | 455/425 |
| 2006/0126408 A1 | 6/2006 | Bucksch |
| 2006/0136656 A1 | 6/2006 | Conley et al. |
| 2006/0146017 A1 | 7/2006 | Leung et al. |
| 2006/0208350 A1 | 9/2006 | Poo et al. |
| 2006/0230437 A1* | 10/2006 | Alexander Boyer ........................ |
| | | G06F 21/6245 |
| | | 726/4 |
| 2006/0232933 A1* | 10/2006 | Wang .................... H01L 23/467 |
| | | 361/697 |
| 2006/0279250 A1 | 12/2006 | Keely et al. |
| 2007/0000396 A1 | 1/2007 | Kieck |
| 2007/0028138 A1 | 2/2007 | Noya et al. |
| 2007/0070188 A1 | 3/2007 | Shyu |
| 2007/0081315 A1 | 4/2007 | Mondor et al. |
| 2007/0087725 A1 | 4/2007 | Anderson |
| 2007/0097622 A1* | 5/2007 | Leech ..................... G06F 1/206 |
| | | 361/679.54 |
| 2007/0097625 A1* | 5/2007 | Chen .................... H05K 1/0203 |
| | | 361/679.54 |
| 2007/0101039 A1* | 5/2007 | Rutledge ............... G06F 1/1632 |
| | | 710/303 |
| 2007/0126988 A1 | 6/2007 | Gohman |
| 2007/0137463 A1 | 6/2007 | Lumsden |
| 2007/0150953 A1* | 6/2007 | Hamid .................... G06F 21/31 |
| | | 726/23 |
| 2007/0204041 A1 | 8/2007 | Hoblit |
| 2007/0222758 A1 | 9/2007 | Mulcahy et al. |
| 2007/0250653 A1* | 10/2007 | Jones .................... G06F 16/273 |
| | | 710/303 |
| 2007/0279996 A1 | 12/2007 | Rolandi et al. |
| 2008/0002350 A1* | 1/2008 | Farrugia ............... G06F 1/1632 |
| | | 361/679.43 |
| 2008/0002355 A1 | 1/2008 | Carnevali |
| 2008/0008324 A1 | 1/2008 | Sim et al. |
| 2008/0133695 A1* | 6/2008 | Suzuki ................ G06F 11/2074 |
| | | 709/216 |
| 2008/0259555 A1 | 10/2008 | Bechtolsheim et al. |
| 2009/0053439 A1 | 2/2009 | Sung et al. |
| 2009/0094625 A1 | 4/2009 | Yamamoto |
| 2009/0126009 A1 | 5/2009 | Amouse |
| 2009/0154084 A1 | 6/2009 | Goto et al. |
| 2009/0200367 A1 | 8/2009 | Amouse |
| 2010/0023650 A1* | 1/2010 | Prevost .................. G06F 21/34 |
| | | 710/16 |
| 2010/0217910 A1 | 8/2010 | Bryant-Rich |
| 2010/0270188 A1 | 10/2010 | Dotson |
| 2010/0287369 A1* | 11/2010 | Monden ................. G06F 21/32 |
| | | 713/156 |
| 2010/0321904 A1 | 12/2010 | Kim |
| 2011/0013348 A1 | 1/2011 | Seibold et al. |
| 2012/0020024 A1 | 1/2012 | Dunwoody et al. |
| 2019/0294578 A1* | 9/2019 | Arnouse ............. G06F 11/1423 |
| 2021/0080772 A1* | 3/2021 | Diaz ...................... B60K 35/00 |

FOREIGN PATENT DOCUMENTS

| | | |
|---|---|---|
| CN | 102007468 A | 4/2011 |
| CN | 102007478 A | 4/2011 |
| EP | 1 486 910 A2 | 12/2004 |
| WO | 94/14128 | 6/1994 |
| WO | 99/54804 A2 | 10/1999 |
| WO | 00/42491 A1 | 7/2000 |
| WO | 03/032551 A1 | 4/2003 |

OTHER PUBLICATIONS

Ricardo A. Barratto, Shaya Potter, Gong Su, and Jason Nieh, *MobiDesk: Mobile Virtual Desktop Computing*, MobiCom. '04. Sep. 26-Oct. 1, 2004, Philadelphia, PA, pp. 1-13.

Brad A. Myers, *Using Handhelds and PCs Together*, Nov. 2001, vol. 1, No. 11, Communications of the ACM, pp. 34-41.

Muneeb Ali and Loen Langendoen, *TinyPC: Enabling Low-Cost Internet Access in Developing Regions*, NSDR '07, Aug. 27, 2007, Kyoto, Japan, (6 pages).

Kvitka. Andre, "Moby Brick Succeeds with Unique Form of Portability;" InfoWorld; Oct. 21, 1991; 13, 14; Proquest Central p. 130.

"PowerBook Duo Dock User's Guide for the PowerBook Duo Dock and Duo Dock II," Apple Computer, Inc., 1993.

"Defendant Motorola Mobility, Inc.'s Response to Arnouse's Infringement Contentions." Case No. 5-11-cv-155-CR *Amouse Digital Devices Corp.*, v. *Motorola Mobility, Inc.*, Apr. 16, 2012.

"Appendix A—Defendant Motorola Mobility, Inc.'s Responses to Plaintiff's Claim Chart for Alleged Infringement of Claims of U.S. Pat. No. 7,316,484."

"Plaintiff's Infringement Contentions," Case No. 3:11-cv-155 *Arnouse Digital Devices Corp.* v. *Motorola Mobility, Inc.*, Mar. 26, 2012.

"Exhibit 1: Claim Chart for U.S. Pat. No. 7,516,484: Claims 1, 3, 7, 15, 16, 18 and 20."

"Exhibit 2: Claim Chart for U.S. Pat. No. 7,516,484: Claims 1, 3, 7, 15, 16, 18 and 20."

(56) References Cited

OTHER PUBLICATIONS

"Exhibit 3: Claim Chart for U.S. Pat. No. 7,516,484: Claims 1, 3, 7, 15, 16, 18 and 20."
"Exhibit 4: Claim Chart for U.S. Pat. No. 7,516,484: Claims 1, 3, 7, 15, 16. 18 and 20."
"Exhibit 5: Claim Chart for U.S. Pat. No. 7,516,484: Claims 1, 3, 7, 15, 16, 18 and 20."
"Exhibit 6: Claim Chart for U.S. Pat. No. 7,516,484: Claims 1, 3, 7, 15, 16, 18 and 20."
"Exhibit 7: Claim Chart for U.S. Pat. No. 7,516,484: Claims 1, 3, 7, 15, 16, 18 and 20."
"Exhibit 8: Claim Chart for U.S. Pat. No. 7,516,484: Claims 1, 3, 7, 15, 16, 18 and 20."
"Complaint for Patent Infringement and Demand for Jury Trial," Case No. 5:11-cv-155 *Arnouse Digital Devices Corp.*, v. *Motorola Mobility, Inc*, Jun. 16, 2011.
Defendant Motorola Mobility, Inc. 's Preliminary Invalidity Contentions, Case No. 5:11-ev-155-cr *Arnouse Digital Devices Corp.*, v. *Motorola Mobility, Inc.*, Apr. 16, 2012.
Final Written Decision, *Motorola Mobility LLC* v. *Arnouse Digital Devices Corporation and Michael Arnouse*, Case IPR2013-00010 U.S. Pat. No. 7,516,484.
United States Patent and Trademark Office, Before the Patent Trial and Appeal Board, *Motorola Mobility LLC* v. *Michael Arnouse*, Case IPR2013-00010 (MT) U.S. Pat. No. 7,516,484.
Indian Official Action dated Dec. 23, 2020, along with the English translation of corresponding Indian Application No. 201844008531.
Chinese Office Action dated Sep. 28, 2020, along with the English translation of corresponding Chinese Application No. 201810240871. 9.
European Official Action dated Apr. 16, 2021 of corresponding European Application No. 18 162 159.0.

\* cited by examiner

PORTABLE COMPUTING SYSTEM AND PORTABLE COMPUTER FOR USE WITH SAME

CROSS-REFERENCE TO RELATED APPLICATIONS

This application is a continuation of U.S. application Ser. No. 16/185,092 filed Nov. 9, 2018 and entitled "Portable Computing System and Portable Computer for Use with Same," which is a continuation of U.S. application Ser. No. 15/466,236 filed Mar. 22, 2017 and entitled "Portable Computing System and Portable Computer for Use with Same" (now U.S. Pat. No. 10,235,323), which is a continuation-in-part of U.S. application Ser. No. 14/845,405 filed Sep. 4, 2015 and entitled "Mobile Data Center," which is a continuation of U.S. application Ser. No. 14/507,408 filed Oct. 6, 2014 and entitled "Mobile Data Center" (now U.S. Pat. No. 9,141,139), which is a continuation-in part of U.S. application Ser. No. 13/404,787 filed Feb. 24, 2012 and entitled "Portable Computing System And Portable Computer For Use With Same" (now U.S. Pat. No. 9,010,623), which is a continuation of U.S. application Ser. No. 12/402,712 filed Mar. 12, 2009 and entitled "Portable Computing System And Portable Computer For Use With Same" (now U.S. Pat. No. 9,010,645), which is a continuation-in-part of U.S. application Ser. No. 12/099,000 filed Apr. 7, 2008 and entitled "Portable Computing System, Apparatus And Method" (now U.S. Pat. No. 7,533,408), and claims the benefit of U.S. Application Ser. No. 61/028,373 filed Feb. 13, 2008 and entitled "Portable Computer", and is a continuation-in-part of U.S. application Ser. No. 12/099,032 filed Apr. 7, 2008 and entitled "Reader Adapted For A Portable Computer" (now U.S. Pat. No. 7,516,484), which also claims benefit of U.S. Application Ser. No. 61/028,373 filed Feb. 13, 2008 and entitled "Portable Computer", the contents of each of which are incorporated herein by reference.

TECHNICAL FIELD

The present disclosure relates to computing systems and in particular to a portable computer that is small in size so as to be easily carried, and yet have the capabilities of a conventional large scale computer, and also secure to address concerns as to data theft and corruption. The present disclosure also relates to portable computing systems and to a mobile data center.

BACKGROUND

Computers have historically been large in size based on the components required for providing sufficient computing capabilities, such as mainframe computers. With the advent of personal computers, computers which once would fill the size of a room were able to be reduced in size so as to be contained within a single desktop device. However, desktop computers which require a large tower to house the processing components, a monitor and keyboard are not conducive to being taken from place to place. Instead, laptop computers were developed to contain the computer processing capabilities, monitor and keyboard within a smaller unitary package, in order to allow transport from place to place. However, laptop computers are still fairly large in size and also sacrifice quality as compared to desktop computers. Moreover, desktop, laptop and mainframe computers all suffer from being susceptible to data corruption from viruses or worms, and also to data theft from hackers. While computers need to be immune to these threats, they also need to be portable and convenient to use easily almost anywhere.

There is a need for a computing system that is portable, can be used in a number of different applications, and protects sensitive information. The present disclosure provides a computing system that satisfies these needs and provides additional advantages.

SUMMARY OF THE DISCLOSURE

The present disclosure comprises, in an exemplary embodiment, a hand-held sized, portable computer and a computing system comprised of at least one portable computer and at least one reader configured to interact with portable computers. The portable computer has all of the components of a fully functional conventional, general purpose computer. The portable computer is small in size. In one embodiment, it is the size of a credit card. In other embodiments, it is the size of multiple credit cards stacked on top of one another. In yet further embodiments, it is encased and about 85 mm by about 55 mm by about 5 mm. The foregoing dimensions allow the portable computer to be easily carried in a wallet or one's pocket. Various embodiments provide the versatility of a "Pocket PC" with the advantages and capabilities of a traditional computer. For example, the portable computer is easily transportable and the portable computer reader provides use of a full computer with a full-sized screen, keyboard, etc.

In some embodiments, the present disclosure relates to a computing system comprising a portable computer and one or more readers. The portable computer comprises storage and at least one connector which connects to at least one reader. The one or more readers each comprise a housing and at least one connector which connects to the portable computer. The portable computer excludes means for a user to interact directly with the portable computer. The portable computer is no greater in size than 100 mm by 60 mm and is no greater than 6 mm thick. The portable computer is configured so that a user cannot interact with the portable computer unless the portable computer is connected to the at least one reader. The housing comprises at least one input device and at least one output device that facilitates direct user interaction with the portable computer. The one or more readers are non-functioning shells when not connected to a portable computer. The one or more readers become fully functional general purpose computers after being connected with the portable computer.

In some embodiments, the portable computer comprises components of a fully functional general purpose computer. In some embodiments, the computing system of the present disclosure further comprises at least one of a processor 282, a controller 280, memory 281, a microphone, a speaker, a power supply, a temperature sensor, a biometric scanner, a radio frequency identification (RFID) tag, a global positioning system (GPS) processor, a secure cryptoprocessor, a camera, a keyboard, a keypad, and a touch screen. Some embodiments of the computing system may also comprise a wireless communication interface, where the wireless communication interface supports a wireless communication protocol including at least one of wireless fidelity (WiFI), Bluetooth™, third generation (3G) cellular, fourth generation (4G) cellular, and radio frequency identification (RFID). In some embodiments, the computing system may further comprise a wired communication interface, where the wired communication interface supports a wired communication protocol including at least one of universal serial bus (USB), high definition multimedia interface (HDMI), displayport (DP), FireWire, and Ethernet. In a further embodiment, the computing system may also comprise a heat sink or a fan. In a further embodiment, the computer system may further comprise a reader associated with at least one of a television (TV), a kiosk, a digital signage, an automobile, an appliance, a personal computer, a server, and a data center.

In another embodiment, the present disclosure relates to a portable computer comprising at least one card. The at least one card comprises at least one connector which connects to at least one reader for interacting with the reader and storage. The portable computer excludes means for a user to interact directly with the portable computer independent of the reader. The at least one reader facilitates direct user interaction with the portable computer, with the portable computer configured to be inoperable unless connected to the at least one reader. The at least one card of the portable computer is no larger than 100 mm by 60 mm and is no thicker than 6 mm thick and comprises all of the components of a fully functional general purpose computer.

In some embodiments, at least one card of the portable computer is no larger than 95 mm by 55 mm and is no thicker than 5 mm. In a further embodiment, the portable computer further comprises two cards stacked on top of each other, with each card being no larger than approximately 90 mm by 60 mm and no thicker than approximately 3 mm thick. One card comprises only the storage and an operating system and the other card a processor, where at least one card comprises the connector. In some embodiments, the storage comprises flash memory and an operating system and the portable computer further comprises one or more selected from the group consisting of a central processing unit (CPU) device and a GPS device. In some embodiments, the storage of the portable computer has a plurality of separate independently accessible compartments for storing different information. the at least one reader comprises at least one biometric scanner. The information is accessed and transmitted based on the biometric information read by the biometric scanner such that access to each compartment is controlled by the reading of the biometric scanner. In some embodiments, the at least one reader comprising an input device and an output device for facilitating direct user interaction with the portable computer. In some embodiments, the input device is selected from the group consisting of: a keyboard, a keypad, a webcam, a touch screen, a microphone, a personal digital assistant (PDA) and a video recorder and the output device selected from the group consisting of: a monitor, a display and speakers. In some embodiments, the at least one reader comprises a housing and a slot in the housing that is configured to receive the at least one card, where the at least one reader further comprises a connector within the slot that connects with the connector of the at least one card so that the at least one card and the at least one reader may interact with each other.

In some embodiments, the portable computer can be used with other computers and other types of devices, including but not limited to televisions (TV's), kiosks, digital signage, automobiles, appliances, such as washers, dryers, refrigerators, etc., personal computers, servers, data centers, mobile data centers, keyboards, displays, touch screens, computer mice, speakers, phones, desktop docks, all-in-one monitors, hard drives, optical drives, CDs, DVDs, BlueRay™ players, flash memory, floppy disks, magnetic tape, paper tape, standalone RAM disks, ZIP drives, GPSs, biometric scanners or readers, cable set top boxes, cameras, etc.

In some embodiments, the portable computer is operable only when used with a reader. For example, a user cannot interact with the computer unless the computer is connected to at least one reader. The portable computer reader supplies the means for a user to interact with the portable computer and the programs thereon; for example, the portable computer reader can comprise a monitor and/or a keyboard. In essence, the portable computer reader is a non-functioning "shell" when not connected to the portable computer. However, once the portable computer is connected to the portable computer reader, the portable computer and the portable computer reader create a fully operational computing system. For example, the reader becomes a fully functional general purpose computer after being connected with the portable computer. The portable computer thus acts as the brain and the portable computer reader operates as the body which will perform the functions, however, without the brain, the body will do nothing.

When a user is finished, he or she simply removes the portable computer and can take it with him or her. Because the portable computer reader is a shell, none of the user's information is left behind. All cookies, keystrokes, downloaded files, etc. remain with the portable computer. Thus, various embodiments do not make any information, including sensitive information, available to subsequent users of the portable computer reader. In addition, there is virtually no danger that the portable computer reader could be affected by a computer virus for this same reason, as there is no capability for the portable computer reader to retain any data from a previous person's use. As a result, the applications for the portable computer are almost limitless where security and privacy of content is a concern, and where there may be concern of corruption by viruses or worms. For example, applications include, but are not limited to, hotels, internet cafes or other public locations, such as libraries or universities, etc.

The portable computer comprises additional levels of security. For example, in one embodiment, components of the printed circuit board of the computer are coated with a coating. The coating may make the components brittle, causing them to break when they are tampered with. The coating may make the components sticky, making it extremely difficult to remove them from the PCB. In addition, in other embodiments, the PCB and other components of the portable computer are encased within a rigid casing. Finally, the portable computer may comprise an RFID tag configured to interact with an RFID reader of the computing system. The RFID reader and/or RFID tag make a loud audible sound or trip a "silent alarm" when the portable computer is moved to or located in an impermissible location, for example, where an unauthorized user attempts to move the portable computer from a location containing multiple computer readers.

Further, in certain embodiments, the portable computer may comprise one or more flash memory devices or flash drives. A flash drive is a storage device that uses flash memory rather than conventional spinning platters to store data. Advantages of using flash memory or flash drives with the portable computer is that there is little delay time when starting up, such as is the case when booting conventional computers. Also, flash memory is non-volatile, which means that it does not need power to maintain the information stored in the device. As a result, the portable computer requires only low power for operation, which can be readily supplied by batteries or similar low power sources, such as solar cells. The flash memory can also be tailored to provide as much storage capacity as may be desired depending on the particular application.

In another embodiment, the present disclosure relates to a method of using a computing system having one or more readers and at least one portable computer configured to interact with the one or more readers. The method comprises: providing the at least one portable computer comprising a length L, a width W and a height H, where L is in a range between about 50 mm to about 200 mm, W is in a range between about 25 mm to about 100 mm and H is in a range between about 1 mm to about 20 mm. The at least one portable computer comprises all of the components of a fully functional general purpose computer and that excludes an input and output device. The at least one portable computer being configured so that a user cannot interact with the at least one portable computer unless the at least one portable computer is connected to the one or more readers. The method further comprises providing at least one reader having an input and output device for interacting with the at least one portable computer; connecting the portable computer to the at least one reader, where the at least one portable computer become a substantially fully functional general purpose computer when connected with the at least one reader; interacting with the at least one portable computer via the input and output device of the at least one reader; and disconnecting the at least one portable computer from the at least one reader.

In another exemplary aspect, a readily mobile deployable data center (DDC) is described that is capable of being transported by hand, the mobile DDC comprising a secure carrying case including a top portion and a bottom portion having a plurality of sidewalls; at least one reader removably disposed within the bottom portion; and a portable computing device having a processor and removably coupled to the at least one reader, the portable computing device being disposed within the securing carrying case so as to have the major plane of the portable computing device parallel to the major plane of the at least one reader.

BRIEF DESCRIPTION OF THE DRAWINGS

For the purpose of illustrating the disclosure, the drawings show aspects of one or more embodiments of the disclosure. However, it should be understood that the present disclosure is not limited to the precise arrangements and instrumentalities shown in the drawings, wherein.

DETAILED DESCRIPTION

The following embodiments of the disclosure may be implemented using hardware or software or any combination of the two where desired.

As described in more detail below, a high density server (HDS) includes a plurality of portable devices, such as the portable computer described herein, which may be referred to as a "Pocket PC." The disclosure also comprises a computing system having at least one portable computer and one or more portable computer readers. Versions of the portable computer, computing system and method of using same are shown and described in Applicant's U.S. Pat. No. 7,533,408, which is incorporated by reference for its discussion of the same. Versions of the computer readers and method of using same are described in Applicant's U.S. Pat. No. 7,516,484, which is also incorporated by reference for its discussion of the same. Applicant's U.S. Pat. No. 7,472,275, also describes various embodiments of a portable computer, computing system, and method, and is incorporated by reference for its discussion of the same.

Figure 1:
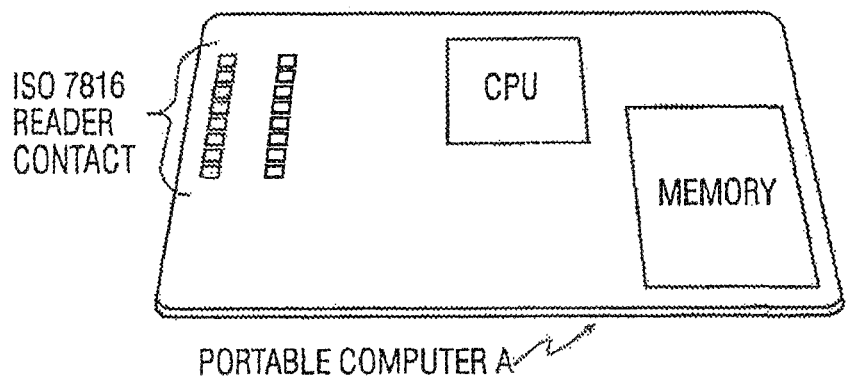
FIG. 1 is a perspective view of an embodiment of a portable computer according to the present disclosure.
Figure 2:
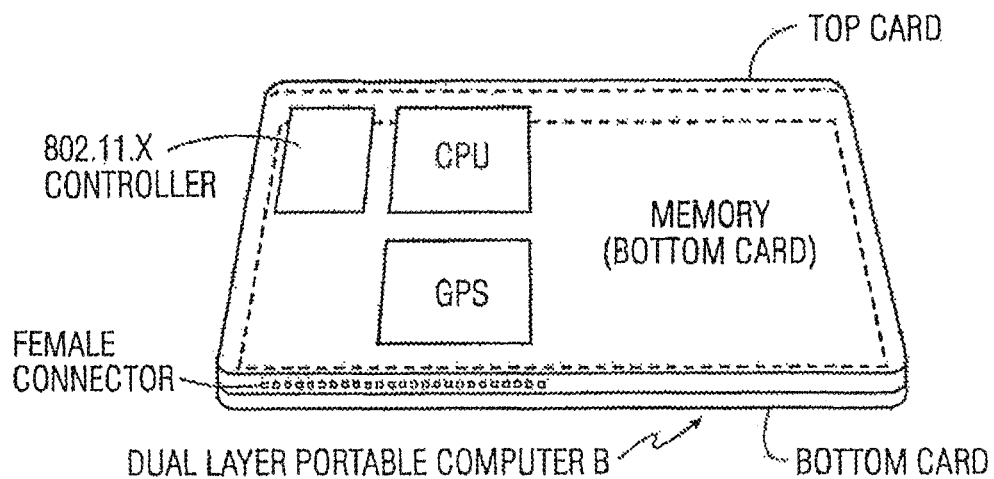
FIG. 2 is a perspective view of another embodiment of a portable computer according to the present disclosure.
Figure 3:
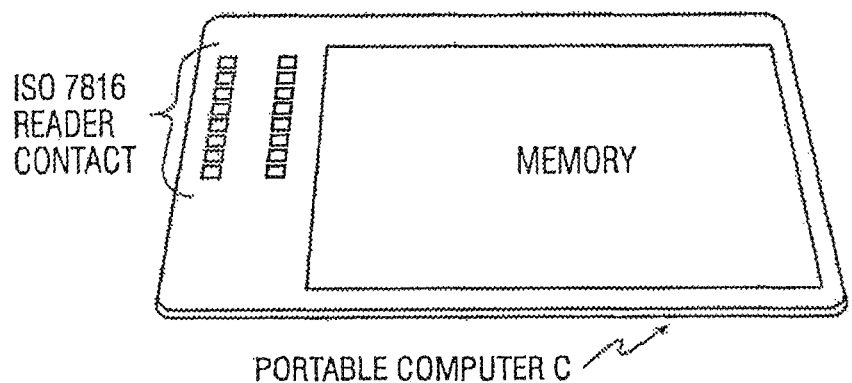
FIG. 3 is a perspective view of another embodiment of a portable computer according to the present disclosure.

Turning now to a discussion of the portable computers and portable computer readers that work in conjunction with the portable computers, in FIGS. 1-3 there are first illustrated several portable computers according to different embodiments. In general, the portable computer comprises a card, preferably the size of a credit card, so as to be easily carried in one's pocket or wallet. FIGS. 4-7, and 19A-19B illustrate embodiments of at portable computer reader, also referred to herein as a "reader", which is described in more detail below. The portable computer readers may comprise a main docking station that is used to interact with the portable computer, such as, but not limited to, a computer keyboard and monitor, phone, or cell phone. Any of the portable computer readers may also include a card reader and/or a biometric reader, as described in more detail below.

In one embodiment, the portable computer is hand-held, transferable, removable and portable. As shown in FIG. 1, in one embodiment ("Portable Computer 'A'"), the portable computer is a card with a CPU, reader contacts and memory. As shown in FIG. 3 ("Portable Computer 'C'"), in another embodiment, the computer may comprise only a memory and reader contacts. All of the components shown in FIGS. 1 and 3 may be on a surface of the card, preferably, embedded thereon, or may be internally within the card. The cards have embedded integrated circuits which can process information. This implies that the computer can receive input which is processed by way of the ICC applications and delivered as an output.

The card may be of any desired size and thickness, which may also be attributed to desired capabilities and technologies used, such as memory/storage requirements. Dimensions may be credit card size. In an embodiment, the portable computer is no greater in size than 100 mm by 60 mm and is no greater than 6 mm thick. In another embodiment, the portable computer is 95 mm long by 55 mm wide by 5 mm thick. In yet further embodiments, the card may meet ID-1 of ISO/IEC 7810 standard, which defines card size as 85.60 by 53.98 mm. Thus, the card may be generally no larger than approximately 90 mm by 60 mm and no greater than approximately 8 mm thick. The card may be other sizes such as ID-000 which is 25 by 15 mm. The card may be about 0.76 mm thick. The card may also have at least one means for attaching the card to a rope, chain, string, etc. for easy transportation. Such means may be a hole 285 or opening in the card or a hook or fastener attached to the card. In another embodiment, the portable computer comprises a length L, a width W and a height H, wherein L is in a range between about 50 min to about 200 mm, W is in a range between about 25 mm to about 100 mm and H is in a range between about 1 mm to about 20 mm.

As shown in FIG. 2 ("Dual Layer Portable Computer 'B'"), in one embodiment, the computer comprises at least two cards connected. Preferably, the cards are stacked one on top of the other but may be connected in other ways. The cards may be credit card sized, as described above. The cards may be stacked directly on top of one another or there may be a space between that may hold computing components. In an embodiment, a portable computer may comprise two cards stacked on top of each other, each card no larger than approximately 90 mm by 60 mm and no thicker than approximately 3 mm thick, where one card comprises only storage and an operating system and the other card a processor, where at least one card comprises the connector. The top card may comprise a controller, CPU and GPS and a female connector on an edge. It may also comprise additional elements such as a GPS chip, processor, RFID crypto memory, logic element, specialized reader contact, controller, microprocessor, and means for interacting with the portable computer readers, such as pins, USB, etc. The bottom card may comprise all memory. In a some embodiments, at least one card may comprise storage comprising flash memory and an operating system, and the portable computer further comprises one or more selected from the group consisting of a CPU device and a GPS device. It would be understood that the cards may comprise different elements than shown. In another embodiment, shown in FIGS. 9 and 10, the portable computer contains its computing components within a housing so that the physical components are not easily removable from the portable computer. In this embodiment, the computer is preferably a box or rectangular prism but may take other shapes. The portable computer may take other forms larger or smaller than a credit card, for example, a compact disc, cell phone, PDA, Smartphone, etc. Either card may also have at least one means for attaching the card to a rope, chain, string, etc. for easy transportation. Such means may be a hole or opening in the case or a hook or fastener attached to the card.

Regardless of the form of the computer, in the embodiments shown in FIGS. 1 and 2, the portable computer may contain all of the components of a fully functional, conventional general purpose computer but, generally, is without means for interacting with the computer, as described below. "General purpose computer" means that the computer contains sufficient hardware and software that will enable a user to do many different things with the computer such as type documents, send e-mail, browse the Internet and play games. In the embodiment shown in FIG. 3, the portable computer comprises only a memory and ISO 7816 reader contacts for connecting to the portable computer readers. In some embodiments, a reader may become fully functional general purpose computers after being connected with the portable computer.

As shown, at the least, the portable computer's components include a main or primary memory and a connector for connecting to a reader. The connector may be a female connector for receiving pins. The connector may be comprised of a grid of conductive targets on a printed circuit board (see e.g., FIGS. 9 and 10). The targets may be coated with a non-corrosive plating to prevent excessive wear on the targets from repeated contact with the connector of the reader. The reader may comprise the connector body so that the portable computer need only comprise a pattern of plated, copper pads to complete the electrical connection to the reader. The portable computer connector may be gold plated.

As provided above, the portable computer may comprise at least one storage component such as memory. Two classes of solid state memory (i.e., hard drive-type storage) may be available. The memory may be a multi-level cell and a single-level cell. The storage component may also be volatile memory. The volatile memory may be a dynamic random access memory. The dynamic random access memory may be DDR2. The DDR2 memory may support processors of speeds of about 400 MHz and about 533 MHz. In another exemplary embodiment, the dynamic random access memory is DDR3 and may support speeds up to and exceeding 1066 MHz. In one embodiment, the portable computer comprises both volatile and solid state memory. In some embodiments, the portable computer comprises storage that has a plurality of separate independently accessible compartments for storing different information.

A controller may be incorporated into the portable computer to increase the transfer rate. The portable computer may also comprise a dynamic memory. A central processing unit ("CPU") may reside in the card or the portable computer reader. For example, where minimal processing capabilities may be required, the CPU may readily be accommodated within the computer card. In addition, in embodiments where significant processing capabilities are desired, a larger sized CPU may be preferred, which may be easier to accommodate by locating the CPU in the portable computer reader, such as in the keyboard and/or monitor. Alternatively, the CPU may be located in the computer reader, as described below.

The CPU is preferably a microprocessor. The CPU, preferably, is designed for portability. As such, it may include 800 MHz of speed so that it uses less power, for example, 0.65 watts and is built to run without active cooling such as a fan. Such a processor may be an "ATOM" processor from INTEL®. The ATOM processors used may be the Z500, Z510, Z520, Z530 and Z540 and subsequent versions. The processor may be available in a 441 pin FCBGA package. The processor may be procured in bare die form and placed as a "flip chip." The combined die-solder package will reduce the processor height to about 0.48 mm. A System Controller Hub may be available in a 1249 pin flip chip ball grid array (FCBFA) package with a height about 2.1 mm. Reducing the package to a bare die leaves a vertical height of about 0.9 mm. The main memory is accessible to the CPU. In one embodiment, there are levels of storage and the primary storage is accessible only to the CPU. The primary storage may comprise processor registers and cache, ROM, as well as BIOS, RAM, magnetic or optical storage. The primary memory may be volatile or non-volatile. The portable computer may also have a non-volatile, read-write, secondary storage, which may not be readable by the CPU. Secondary storage may comprise a hard drive or optical storage devices, such as CD and DVD drives, flash memory (e.g. USB sticks or keys), floppy disks, magnetic tape, paper tape, standalone RAM disks, and ZIP drives. Preferably, the secondary storage is formatted according to a file system format. Where the portable computer is desired to be particularly small, it may not contain a hard drive. Rather, it may contain only ROM and/or RAM, wherein the RAM may be a flash drive.

Loaded onto the memory, preferably, onto the RAM, is software that is executed in the central processing unit. Such software may include application software such as word processors, system software such as operating systems, which interface with hardware to provide the necessary services for application software, and middleware which controls and coordinates distributed systems. The applications may also include control applications. Control applications enable the portable computer to generate control signals interpretable by the portable computer reader, which is explained in more detail below. Control applications may generate a user interface on a display of the portable computer reader and receive user inputs into the portable computer reader by means of the input/output devices in the portable computer reader, which are shown in FIGS. 4-7 and 19A-19B and described below. The control applications translate the user inputs into control signals provided to the portable computer reader.

The system software may include device drivers, diagnostic tools, servers, windowing systems and utilities. In one embodiment, the portable computer comprises the hardware necessary to run the aforementioned software. In other embodiments, this hardware is a part of the portable computer reader. Application software may include business software, educational software, medical software, databases, and word processing software and computer games. The software includes an operating system such as Microsoft Windows® or Windows Mobile, NetBSD, Mac OS X, Linux, Palm OS, or Windows Mobile. Where the processor is an ATOM™ processor, the portable computer may support Mac OS X. The operating system may be capable of using the TCP/IP networking protocols and have a graphical interface and device drivers. The operating system may be placed on the portable computer by the manufacturer or later downloaded by the user. Synchronization can be performed using the operating system's intrinsic tools. This will transfer user parameters, data files, e-mail settings, etc. to the portable computer. The capacity and speed of each core unit can be made compatible with the state-of-the-art computer science as with the enclosures used.

The portable computer may also comprise, but is not limited to, various activation means, a video display controller, SCSI controller, video card, a graphics processing unit, graphics card, graphics chip, sound card, sound interface such as an AC97 interface, sound producing means, input/output controller means, PCMCIA controller, a graphics controller and a serial controller, a power source, which may include an electrical transformer that regulates the electricity used by the computer and means for communication with outside sources of data and information. Preferably, the aforementioned components (CPU, RAM, hard drives, etc.) are attached to a motherboard. The motherboard or circuit board may be a printed circuit board comprising a plurality of stacks. In one embodiment, the printed circuit board is an 8 layer stackup. The PCB may be about 0.075 mm in width. Optimal trace impedance for high-speed traces; e.g., memory and front-side bus, USB, LVDS, etc. is about 50Ω to about 100Ω. With a per-layer thickness of about 0.11 mm, the overall stack-up thickness of the portable computer may be about 0.77 mm. The motherboard may also include a PCI or a planar device for attaching peripheral devices to the motherboard or devices located on or in the portable computer reader. All of the aforementioned components (CPU, RAM, hard drives, etc.) may be attached to a motherboard. The motherboard may be within the portable computer or may be within the portable computer reader.

The portable computer may also comprise a GPS chip, a specialized reader contact, a logic element, a smart card device, and/or RFID crypto memory. The specialized reader contact is the interface to the ports/card readers' specialized readers. It may utilize ISO-7816 pattern locations for interface to the single chip smart card microprocessor, and AFNOR pattern locations for interface to the logic element. The logic element acts as the "policeman" of the card. It directs message traffic and interrogates readers and secure keys to allow access to the compartmentalized data contained in the flash memory. This device may interact with the smartcard chip and the GPS device over SPI communication links. Only if the correct security is met will data access be allowed. The RFID crypto memory may comprise an ISO 14443 compliant contact-less RFID. This allows for expanded use of the card in proximity ID applications. For example, the portable computer may communicate with the reader in a contactless manner, via the RFID. The subsystem is powered up in the presence of an ISO 14443 compliant reader (or, the portable computer reader could be such a reader). Limited duplicate data is stored in encrypted form in CryptoRF memory for access by RFID systems employing the standard protocol. The smart card device is a specifically designed secure micro controller targeted for the existing smart card market, such as produced by ATMEL. The device runs specific application software that allows for standard smartcard, javacard, and secure partitioning control.

To provide a suitably fast boot scenario; e.g., about 15 seconds boot time, the portable computer may use a technique to accelerate startup time. When instructed to shut down, the portable computer may save the contents of its volatile memory to flash in a hibernation process. This process is supported in Windows operating systems, as example. To restart, the portable computer needs only to reload the contents of its memory; a process which generally takes less than about 10 seconds.

Figure 9:
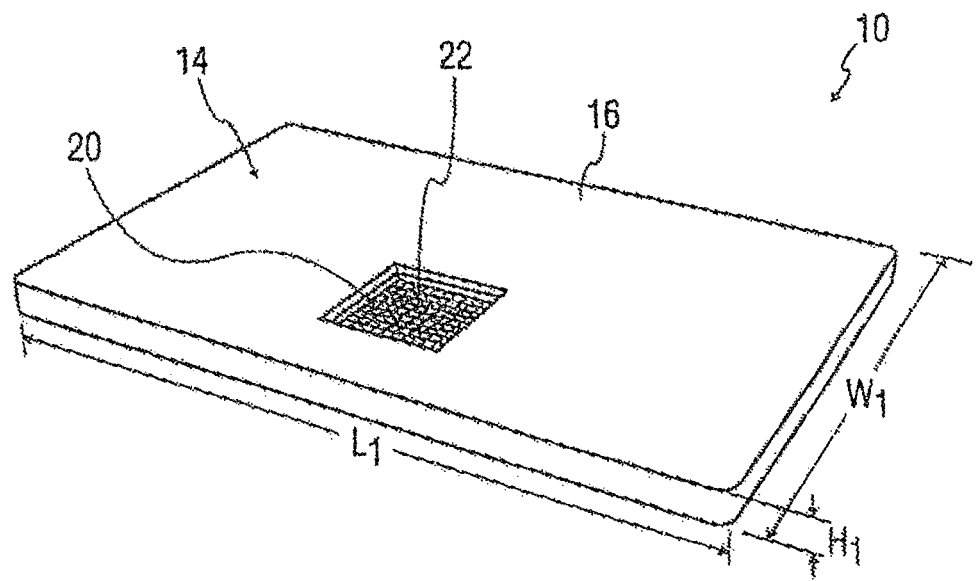
FIG. 9 is a perspective view of another embodiment of a portable computer according to the present disclosure.
Figure 10:
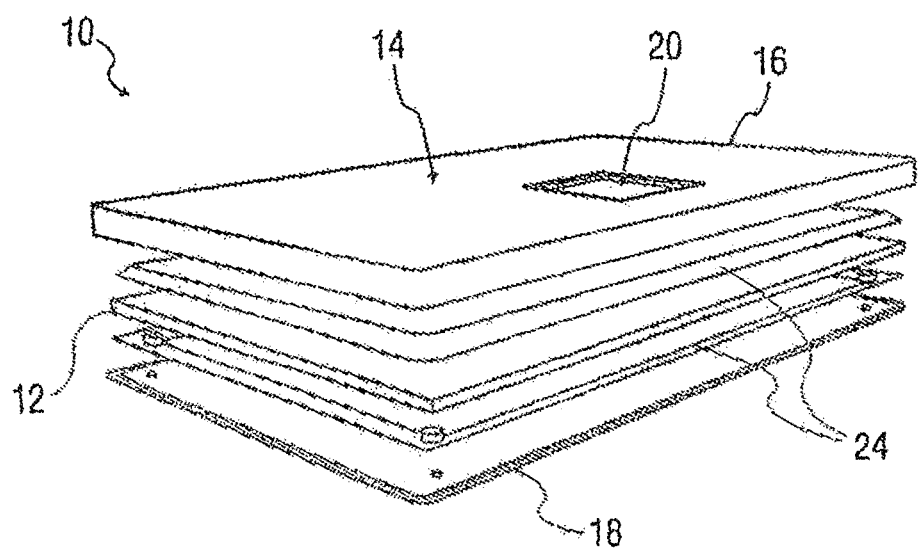
FIG. 10 is an exploded view of the portable computer shown in FIG. 9.

Any version of the portable computer may be encased in a housing. FIGS. 9 and 10 show the embodiment of the portable computer 10 comprised of a printed circuit board 12 having an eight (8) stack-up configuration. Even though an eight stack-up configuration is shown, more or less stack-ups may be used. The portable computer is encased in a rigid housing 14. As shown in FIG. 10, the rigid housing 14 "sandwiches" the printed circuit board 12 and electronic components within two casing portions 16, 18. As explained below, the printed circuit board (or any portion thereof) may be coated with at least one coating 24, such as the housing shown in FIG. 10. The casing portions 16, 18 may be comprised of virtually any rigid material. The casing portions 16, 18 may be thermally conductive. In one embodiment, the casing portions 16, 18 are metal. The casing portions 16, 18 are attached to form a version of the portable computer, which is shown in FIG. 9. As shown in FIG. 9, at least one of the casing portions 16, 18 may have at least one opening or window 20. This opening or window 20 exposes electrical connectors 22 of the portable computer 10, which allow the portable computer 10 to be connected to and interact with at least one reader (not shown). These connectors may be a grid of conductive targets. In the version of the portable computer shown in FIG. 9, the opening 20 is in the upper casing portion 16; however, it may be in the lower casing portion 18, on a side, etc. The casing may also have at least one means for attaching the casing to a rope, chain, string, etc. for easy transportation. Such means may be a hole or opening in the case or a hook or fastener attached to the casing. In an exemplary embodiment, the encased portable computer 10 has length L1, width W1 and height H1. L1 may be about 50 mm to about 200 mm. In another exemplary embodiment, W1 may be about 25 mm to about 100 mm and H1 may be about 1 mm to about 20 mm. In yet another embodiment, L1 is about 80 mm, W1 is about 50 mm and H1 is about 4.5 mm. In a further embodiment, L1 may be about 82.55 mm. In another further embodiment, W1 may be about 51.52 mm and H1 may be about 4.41 mm.

The embedded integrated circuits and other electronic components on any version of the portable computer may be coated with at least one coating. The coating should at least substantially cover the entire integrated circuits (or any single integrated circuit or portion thereof) and may be applied to both sides of a printed circuit board or multiple sides comprising integrated circuits and chips. The coating is comprised of a material that protects the integrated circuits from damage, for example, from water damage or from physical contact with objects that may damage the circuits. The coating should protect the electronic assembly or integrated circuit from damage due to contamination, moisture, fungus, dust and corrosion caused by harsh or extreme environments, etc. The coating material should also protect the integrity of the integrated circuit components (i.e., from tampering or improper accessing of stored data); for example, by hindering or preventing reverse engineering or removal of any circuit components. In particular, an epoxy coating may make the integrated circuit components or electrical equipment brittle so that any attempt to remove or tamper with the components would break or shatter the coated components. A laminate material may also be utilized.

The coating material should also protect the portable computer from damage from rough handling, installation, or reduction of mechanical and thermal stress. The coating may be a protective non-conductive dielectric layer that is applied onto the printed circuit board assembly. The coating may be substantially clear or it may be substantially or partially opaque. The coating may be hard or may have a rubbery or slightly rubbery texture. The coating may provide at least some thermal conductivity from the integrated circuits or electronic components. Where the coating is electrically insulating, thermally conductive elements 284, such as metals or semi-conductors may be included in the coatings to dissipate thermal energy. In addition, channels, openings, holes, etc. in the coatings may be provided to dissipate heat. Coatings that may be suitable include silicone, epoxy, acrylic, urethane and Paraxylene, as examples, Where an epoxy coating is used, the coating may disperse heat generated by the processor to thermally-conductive casing portions, where the heat may be dissipated via a chimney in the casing. Thus, in one embodiment, epoxy and a thermally conductive, for example, metal casing, provide protection of and heat dissipation from the portable computer.

In addition, any version of the portable computer may include security information in the software. The security information allows only authorized users to access certain information on the computer. Access information may include personal identification numbers, security questions, passwords, etc. The portable computer may also contain stored or baseline biometric information such as height, weight, blood type, voice and retinal patterns, fingerprints, pulse rate, etc. The portable computer or reader may comprise a Trusted Platform Module (TPM) 283 chip, which will encrypt and encode both data files and software. Contents of the computer may not be accessible without a user providing matching biometric information, such as a fingerprint. Preferably, the portable computer reader or computer would comprise means for reading the biometric information. Such means include, but are not limited to, a pulse reader, fingerprint reader, retinal scanner, voice recognition recorder, etc. For example, the system may include biometric mice as an input, which includes an integrated fingerprint reader either in the receiver or the mouse. Such biometric information, readers, storage means etc., are disclosed in Applicant's U.S. Pat. No. 7,500,107, the contents of which are incorporated by reference herein.

The portable computer may' also contain at least one sensor configured to detect the portable computer's location and when the portable computer has left a specified area. The sensor may be embedded or otherwise attached to the epoxy, or provided at any other desired location in/on the portable computer. In particular, the sensor may be configured to track the position of the portable computer within a designated area. Such a sensor may cooperate with a tracking device. For example, the sensor may contain at least two parts. One is an integrated circuit for storing and processing information, modulating and demodulating a signal, for example, a radio frequency signal, and other specialized functions. The second is an antenna for receiving and transmitting the signal. Such a sensor may be a radio frequency identification (RFID) tag and the tracking device may be an RFID reader. The RFID tag may be "active" or "passive". The RFID tag may contain identifying information, such as the owner of the portable computer, serial number of certain parts, etc. The RFID reader comprises a module (transmitter and receiver), a control unit and a coupling element (antenna). The RFID reader may be part of a portable computer reader or may stand alone. Communication between the tag and the reader may occur wirelessly. In addition, either or both the tag and/or the reader may be adapted to emit an audible and/or visual signal, for example, when the tag is out of a specified range of the reader or when the tag is within a specified position relative to the reader. For example, if a user removes the portable computer from a designated area, a loud sound may be emitted by the portable computer.

In certain embodiments, the portable computer does not contain means for a user to interact directly with the computer. In other embodiments, the portable computer contains means for interacting therewith. By interacting directly it is meant that a user cannot access the software programs, hardware or other functionality such as sounds, visuals, etc., on the computer without a portable computer reader, which provides the means for accessing the computer, as described below.

As discussed above and shown in FIGS. 4-7 and 19A-19B, such means for interacting with the portable computer may include a reader, which is preferably an input and output device. Such an input/output device may be, for example, a keyboard, display, mouse, speakers, etc. In one embodiment, the portable computer reader provides the only means for a user to interact with or use one or more of the portable computers. For example, at least one reader comprises an input device and an output device for facilitating direct user interaction with the portable computer. The portable computer reader is a non-functioning "shell" when not connected to a portable computer and, therefore, is inoperable for performing computing functions without the portable computer. Once the portable computer is connected to the portable computer reader, preferably, in a plug-and-play style, the system becomes a fully operational conventional computer capable of any known computing operation. For example, a user cannot interact with the computer unless the computer is connected to at least one reader. The reader(s) become fully functional general purpose computers after being connected with the portable computer. When the portable computer is disconnected from the portable computer reader, the portable computer reader once again becomes a shell and the computer cannot be directly accessed unless re-connected to the portable computer reader or another portable computer reader.

As provided above, in one embodiment, the portable computer does not comprise means for a user to interact directly with the contents of the computer. For example, as shown in FIGS. 1-3, the portable computer does not have a display or monitor, a keyboard or keypad, voice input device, etc. Rather, such input devices are included on the portable computer readers. In other embodiments, the portable computer may have such input/output devices. For example, in one embodiment, the portable computer itself is a cell phone that can access the internet via a wireless network. In another embodiment, the portable computer comprises an input device selected from the group consisting of: a keyboard, a keypad, a webcam, a touch screen, a microphone, a personal digital assistant (PDA) and a video recorder and the output device selected from the group consisting of: a monitor, a display and speakers.

Figure 4:
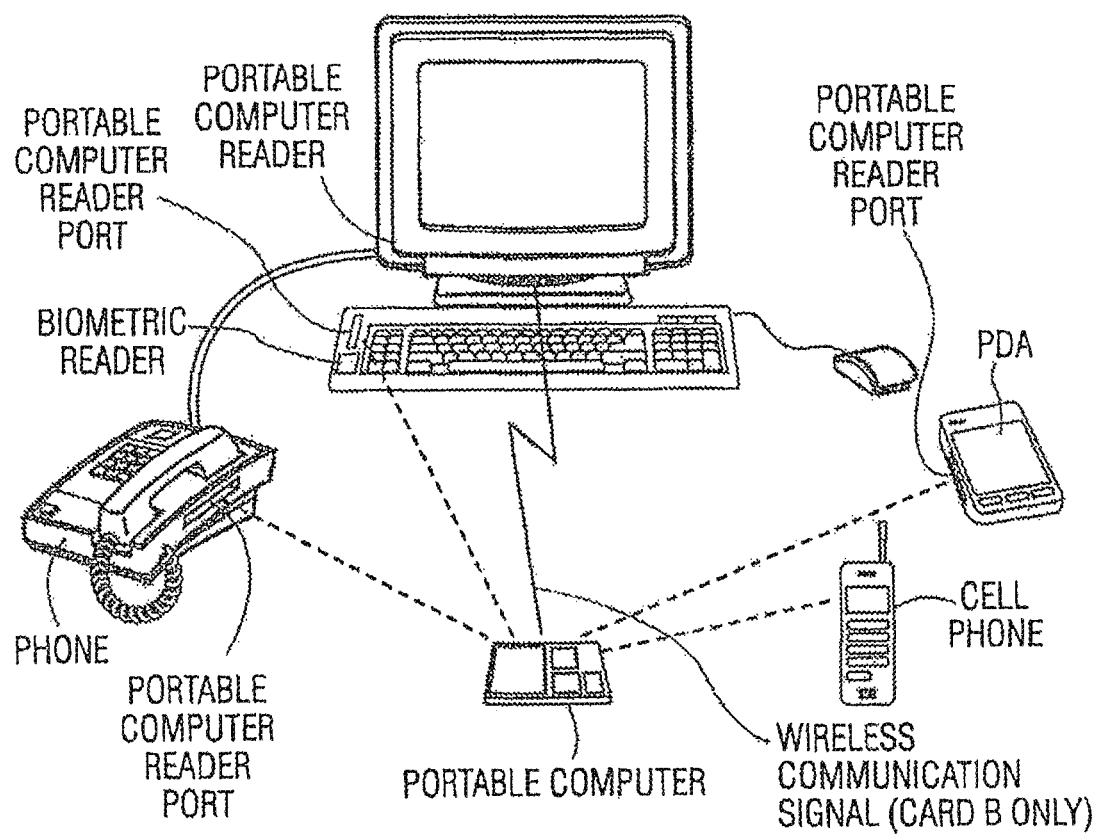
FIG. 4 is a perspective view of an embodiment of a computing system according to the present disclosure.
Figure 5:
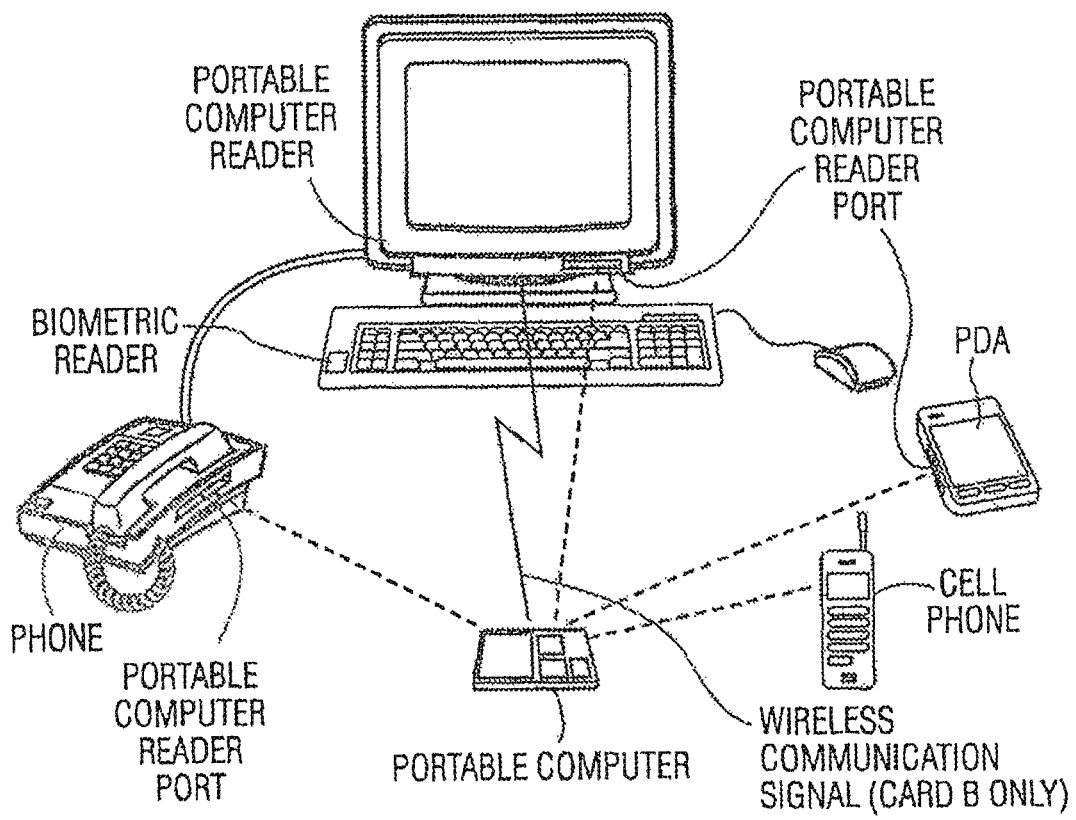
FIG. 5 is a perspective view of an embodiment of a computing system according to the present disclosure.
Figure 6:
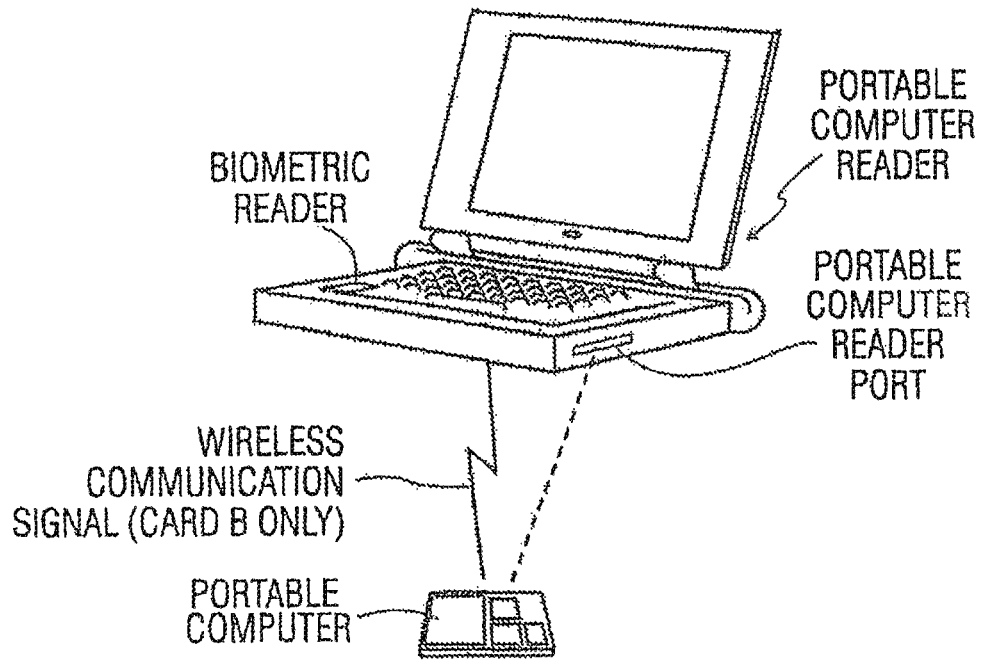
FIG. 6 is a perspective view of another embodiment of a computing system according to the present disclosure.

The portable computer preferably also has means for connecting to any portable computer reader, which means that it can be used virtually anywhere. "Connecting" refers to being attached or in communication with the portable computer reader by being affixed to, stored within or in operable communication with the portable computer reader. As shown in FIG. 1 the female connector may include one uniquely configured universal connector portable computer reader that mates with or fits against a power connector source or activating means in any of the portable computer readers in the system. As shown in FIGS. 4-6, the connecting means may also include a wireless connection between the portable computer and the portable computer readers. Thus, the portable computer may have a wireless transmitter and the portable computer readers a receiver, or vice versa. The universal connector may be a USB-type connector. Regardless of the form of the connector, the connector will be configured to connect to every portable computer reader in the system and provide full computing function once connected. The means for communicating also provides communication or transfer of information over a bus or in a wireless fashion. Preferably, the computer and portable computer reader would support various wireless protocols including, without limitation, 3G/4G, WiFi, Bluetooth™, Wymax, etc. For example, a wireless chip(s) may be contained on the card and/or portable computer reader to accommodate wireless communication with other devices or over the internet.

As provided above, and as shown in FIGS. 4-7 and 19A-19B, a computing system of the present disclosure contemplates a single portable computer being usable by a plurality of portable computer readers. In one embodiment, these portable computer readers are located at various locations that are spread out from one another so that a user can take his or her computer with him or her and use it in remote locations. For example, the portable computer readers can include readers located at central locations for access by numerous users, such as located in computer centers, libraries, universities, internet cafes and/or hotels, as examples. The main function of the portable computer reader is to allow a user to interact with the portable computer. In one embodiment, the portable computer reader is the only device that will allow a user to interact with the computer, which provides additional security. In other embodiment, the reader is configured to interact with portable computers other than those in the system.

As shown in FIGS. 4-7 and 19A-19B, generally, the portable computer reader comprises a housing. In various embodiments, the housing may be an input/output device itself. That is, the housing comprises at least one input and at least one output device that facilitates direct user interaction with the portable computer. However, in other embodiments, the housing may be standalone, i.e., a reader, which must be connected to an input and/or output device. The portable computer reader housing may be a component of a conventional desktop or laptop computer, such as a keyboard, monitor, tower, mouse, etc. In addition, the housing may comprise operating system support for dynamic hardware components and use an un-dock command to release drivers, which are no longer needed once the portable computer has been detached from a reader. Similarly, the portable computer may execute an undock command prior to entering hibernation i.e., when shut down and in the processing of being withdrawn from a reader.

The housing may comprise a power supply, Ethernet port or WiFi and USB ports. The housing 454 may further comprise a wired communication interface, where the wired communication interfaces supports a wired communication protocol including at least one of universal serial bus (USB) 458, high definition multimedia interface (HDMI) 470, displayport (DP) 468, FireWire, and Ethernet 472. In particular, the housing or readers may comprise at least one power generating unit with power generation components. The power supply unit may be configured to convert 100-120 V AC power from the mains to usable low-voltage DC power for the internal components of the computer. The power generating unit may conform with the ATX form factor. The power generating unit may be configured to turn on and off using a signal from the motherboard, and to provide support for modem functions such as a standby mode. The power generating unit may comprise a PC Main power connector for supplying power to the motherboard. The power generating unit may also comprise at least one ATX12V 4-pin power connector that goes to the motherboard to supply dedicated power for a processor. The power generating unit may also have peripheral power connectors. The power generating unit may also have auxiliary power connectors such as Serial ATA power connectors: a 5-pin connector for components which use SATA power plugs, which may supply power at three different voltages: +3.3, +5, and +12 volts; and a 6-pin connector most modern computer power supplies include 6-pin connectors which are generally used for PCI Express graphics cards. The readers may comprise at least one electrical interface for transmitting power to at least one portable computer and the portable computer may comprise an electrical interface for receiving power from at least one reader. The electrical interface of the portable computer may be a plurality of gold-plated pads and the electrical interface of the reader may be a plurality of pins. The electrical interface from the portable computer to the reader should provide both high current power connections as well as high speed data connections. The connector is configured to hold up despite at least 10,000 connect/disconnect cycles. The connector may be a SAMTEC™ GFZ style connector, which may have about 100-900 pins. The connector body may be connected to the reader whereupon the portable computer connector would need only a pattern of gold-plated copper pads.

As is discussed in detail further below, in certain embodiments, the portable computer can be used with other computers and other types of devices, including but not limited to televisions (TV's), kiosks, digital signage, automobiles, appliances, such as, without limitation, washers, dryers, refrigerators, etc., personal computers, servers, data centers, mobile data centers, displays, touch screens, computer mice, processors, controllers, memory, microphones, speakers, power supplies, temperature sensors, biometric scanners or readers, radio frequency identification (RFID) tags, global positioning system (GPS) processors, secure cryptoprocessors, cameras, keyboards, keypads, touch screens, phones, desktop docks, all-in-one monitors, hard drives, optical drives, CDs. DVDs. BlueRay™ players, flash memory, floppy disks, magnetic tape, paper tape, standalone RAM disks, ZIP drives, GPSs, cable set top boxes, etc.

Optional items such as CD/DVD/BlueRay™ players could be implemented as a USB peripheral or be integrated using a high-speed Serial ATA (SATA) interface. In other embodiments, the housing is connected to an input/output device. In the embodiment shown in FIGS. 4 and 5, the reader comprises substantially all the elements of a conventional desktop computer such as a keyboard, mouse, display, etc. a display or monitor, a keyboard and a mouse. As shown, it preferably, does not have a structure that would typically house a hard drive because the reader is, preferably, a shell without the portable computer. In other words, it does not contain the inner workings of a traditional desktop computer but contains the unique configuration of the readers of the present disclosure that allow the readers to interact with the computer but become a shell without the computer. The keyboard and display may be connected by any means known in the art, including a serial bus or wirelessly, for example, by Bluetooth. The mouse may be connected by any means, including a USB connection. Where the reader is portable, such as a laptop, the portable computer and reader may comprise a power notebook which has a faster CPU and where the reader connects to the portable computer via a SATA interface.

As also shown in FIGS. 4 and 5, the portable computer readers may include a PDA, a cell phone, or a LAN phone. Where the reader is a cell phone, the portable computer has a SIM card so that a user can download information such as phone numbers to the portable computer. Where the reader is a cell phone, PDA, etc., it may include a custom application providing the interface to the phone that supports calling, SMS, and MMS transactions. In addition, special drivers may be included to adapt Windows to small, low resolution screens in some hand-held devices. The reader may also be WiFi enabled. Further, the reader may have a SIM card that can become a phone. In this embodiment, the input device is the keyboard, mouse, or PDA touch screen or the PDA or phone's keypad. The output devices are the various displays, speakers, etc.

In the embodiment shown in FIG. 6, the reader appears as a traditional laptop-type computer. The input device is the keyboard and the output device is the display, speakers, etc. It is noted that the structure supporting the keyboard, in one embodiment, does not contain the inner workings of a traditional laptop but contains the unique configuration of the readers of the present disclosure that allow the readers to interact with the computer but become a shell without the computer.

Figure 7:
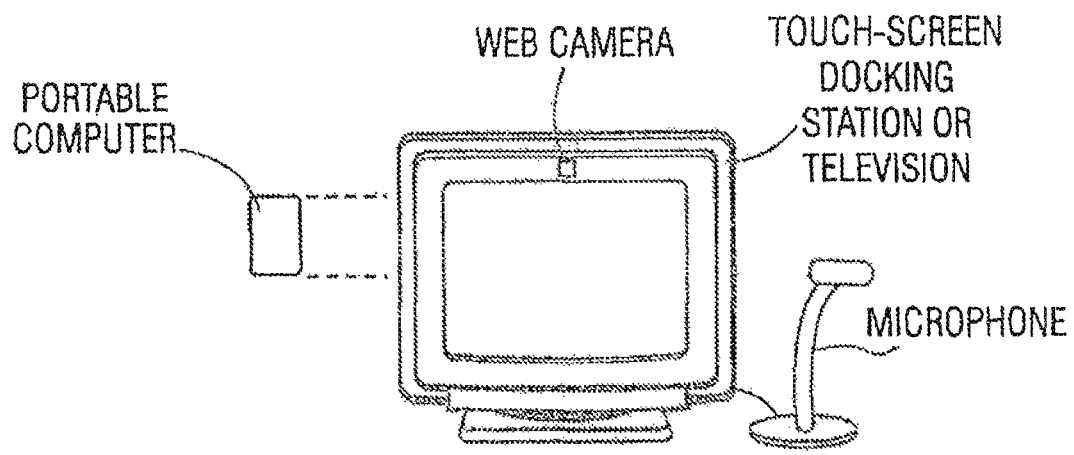
FIG. 7 is a perspective view of another embodiment of a computing system according to the present disclosure.

In the embodiment shown in FIG. 7, the reader is a touch screen, display or television. Thus, the screen may be the input or output device. Another input/output device may be a microphone. The readers may comprise additional input/output devices such as printers, optical drives, speakers, voice recognition hardware, etc. It would be understood that the reader may take many different forms, for example, it may be a "shell" of a CD or DVD player, radio, etc. In other embodiments, a monitor may be eliminated if desired depending on the application and/or other input devices may be utilized instead of a keyboard, such as a touch screen, voice activated input, etc. The portable computer reader may also be relatively stationary or portable, as may be desired.

The reader may be incorporated into a television ("TV"), monitor or similar device that will enable the TV to accept the portable computer, creating a fully functional computer able to connect to the internet (or other network) via, for example, WiFi or Ethernet connection, allowing the user to surf the web, watch Internet TV, or conduct Video over IP, as examples. In various embodiments, certain of the components of the reader, as set forth in the illustrative embodiments above, may be utilized to facilitate such incorporation into a TV in a cost-effective manner.

The reader can also be incorporated into a cable set top box or similar device to provide the same functionality listed above as with the internet television. For example, the video out of the reader can be linked to a 2nd (HDMI out to allow PIP viewing on TV) or to the video circuitry of the cable box allowing the user to switch between cable television and the computer (Internet TV, Video over IP, etc.).

A camera may be incorporated onto or otherwise integrated into a television, cable set top box, reader; or other device that is in communication with either of these foregoing components, to provide additional functionality for use with the portable computer. For instance, the portable computer may be used for the purpose of providing access to and communication over the Internet or any other network, such as via an Internet television or a cable set top box described above, or using any other conventional communication devices and over any media, such as over cable, telephone lines, and/or any wireless networks, etc. The camera could be used for purposes of viewing persons situated in front of the camera and which would then be displayed either locally on that television or remotely on any other destination television reachable over a network. This could be used, for example, as a type of video phone to communicate with individuals that are at remote locations, or just for use as a monitor to display on the television locally, With use of picture-in-picture or split screen capability, it would be possible to display the image from the camera and one or more other items on different parts of the screen at the same time, such as broadcasts, Internet access, cable, video, teleprompter, etc.

In another embodiment (not shown), the reader may be a standalone reader. The reader would include at least one connector for connecting to a separate input and output device. Such a connector may be a USB or SATA connector. The stand alone reader may also include a power supply as well as a biometric scanner. The standalone reader may also comprise VGA, DVI and/or S-video formats. In an embodiment, the portable computer comprises storage having a plurality of separate independently accessible compartments for storing different information, where the reader comprises at least one biometric scanner and where the information is accessed and transmitted based on the biometric information read by the biometric scanner such that access to each compartment is controlled by the reading of the biometric scanner.

The readers also comprise at least one connector for attaching the portable computer to the reader. In one embodiment, the connector is attached to the housing of the portable computer readers. In the embodiments shown in FIGS. 4-7 and 19A-19B, the connector is within a slot or hole for receiving the portable computer. The slot may be located anywhere on the reader, for example, on the keyboard, as shown in FIG. 4 or on the monitor, as shown in FIG. 5. The portable computer reader connector is configured to mate with any of the aforementioned universal connectors on the portable computer. The connector may include a bus as is known in the art. In an embodiment, the portable computer comprises at least one reader comprising a housing and a slot in the housing that is configured to receive the at least one card, where the at least one reader further comprises a connector within the slot that connects with the connector of the at least one card so that the at least one card and at least one reader may interact with each other.

In the embodiments shown in FIGS. 4-6, the portable computer reader utilizes a wireless connection to attach to the portable computer, such as an Ethernet or FireWire. The wireless connection may include modems and network cards. These devices may also allow the portable computer to interact with other portable computers. The portable computer reader is configured to send input to and output from the operating system in the portable computer. In addition to the aforementioned connection, the portable computer has means for interacting and communicating with the portable computer reader.

As shown in FIGS. 4-6, the reader may include a biometric scanner or reader. Such a scanner may include a pulse reader, fingerprint reader, retinal scanner, voice recognition recorder, etc. The system may include biometric mice as an input, which includes an integrated fingerprint reader either in the receiver or the mouse. Such biometric information, readers, storage means etc., are disclosed in Applicant's U.S. Pat. No. 7,500,107, the contents of which are incorporated by reference herein. In addition, the portable computer may include security information in the software. The security information allows only authorized users to access certain information on the computer. Access information may include personal identification numbers, security questions, passwords, etc. The portable computer may also contain stored or baseline biometric information such as height, weight, blood type, voice and retinal patterns, fingerprints, pulse rate, etc. In addition, every portable computer may be tied to a biometric fingerprint scanner, which identifies a given user as the owner of the portable computer. Thus, the fingerprint scan can identify whether the user is the licensee that purchased the portable computer.

Figure 8:
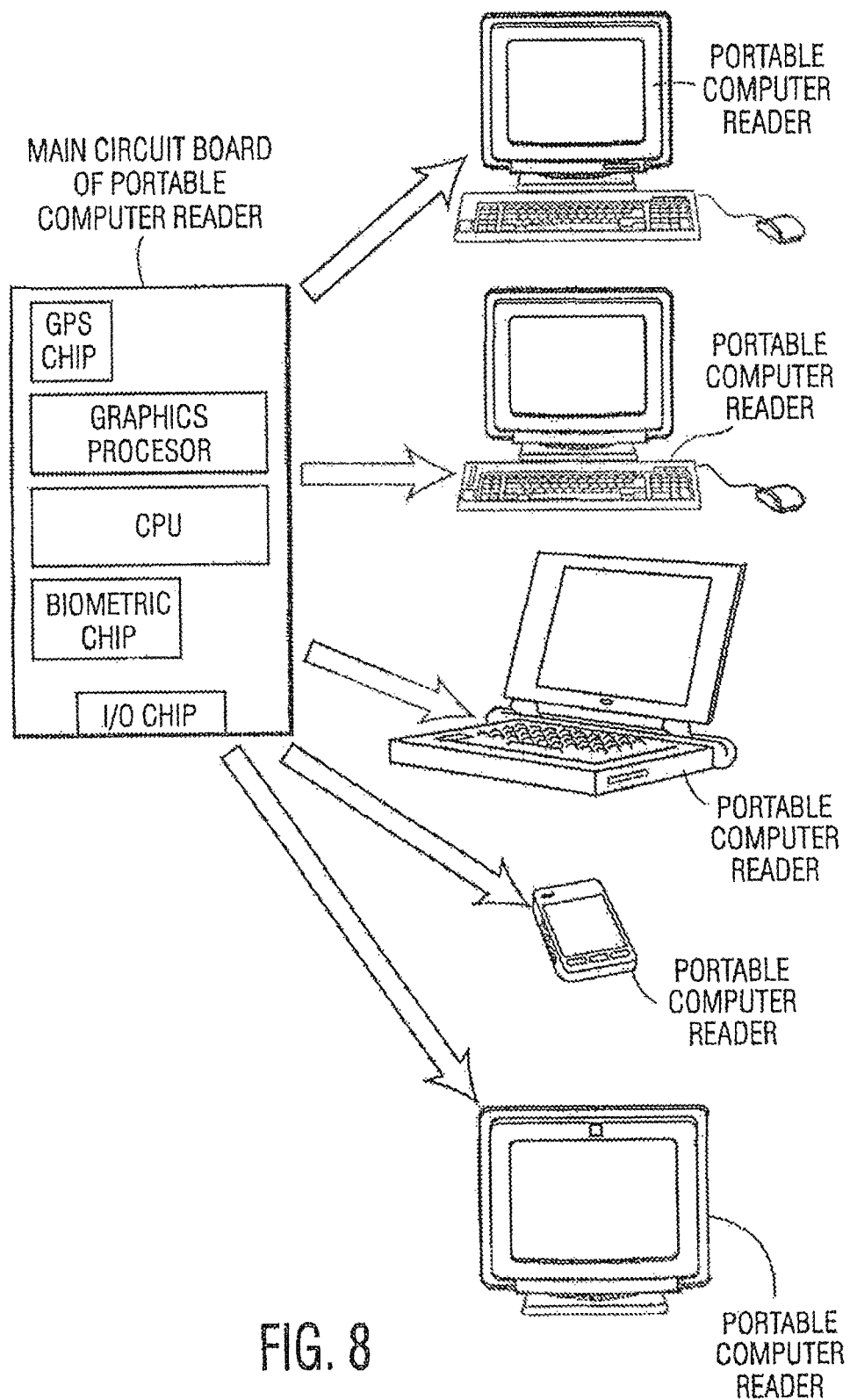
FIG. 8 is a perspective view of various embodiments of a portable computer reader according to the present disclosure.

As shown in FIG. 8, the portable computer readers preferably have a main circuit board comprising, at least, a GPS chip, graphics processor, CPU, biometric chip and an I/O chip. Internally, the housing of the portable computer reader may also include a heat sink/fan, video cards, PCI buses, etc. The housing may also include external bus controllers to connect to external peripherals, speakers, etc. In one embodiment, the portable computer reader supplies power and connections to the portable computer and peripherals. However, in other embodiments, the portable computer reader does not supply power. Rather, the power is supplied by batteries or another power source, such as a solar power cell, coupled to or provided within the portable computer.

The portable computer reader may contain an AC or DC power source and a controller interfacing with the portable computer. Furthermore, location tricking may also be incorporated into the overall system where desired. For example, the reader may be equipped with required front end RF and conversion needed to support a single chip receiver and a global positioning system (GPS) processor in the portable computer. An RF feed may be utilized when the device contained on the card, such as an onboard processor, cannot receive energy from an onboard antenna 278. In one embodiment, when connected to a playback/send unit, an electrical path is created that connects the antenna on the playback/send card reader unit to the single chip GPS solution. Power is then applied via the playback/send unit. Upon power-up and a time delay needed for the GPS signal to be processed, time and location information is available. This location and time information may also be used to time-stamp designated or all transactions in the digital identification card. Furthermore, the playback/send unit may also contain a biometric fingerprint reader that allows correlation from user to stored biometric information on the card. Only a correct match will allow access to data on the computer.

In one embodiment, the portable computer reader is not completely a shell without the portable computer but includes storage with software loaded thereon for "searching" for a portable computer. Thus, after a device is inserted into the portable computer reader, the system will "search" automatically for a portable computer. Once the portable computer reader finds the portable computer, it substantially, immediately runs the computer programs. In other words, the computer does not need to boot up before it is operational. Rather, the portable computer is ready to work immediately, similar to a digital camera. As provided above, the portable computer readers are inert or a shell as a general computing device until the portable computer is connected thereto. The portable computer may be arranged in certain embodiments so that it does not function and is not activated apart from the portable computer reader because the portable computer has all of the components of a conventional (e.g., a fully functional general purpose) computer, except possibly a display and an input source, such as a keyboard/ keypad, and may also include at least one connector to a direct power connection, and a communication bus. In these embodiments, the reader may comprise a CPU, a graphics processor and a GPS device, a sound card, a heat sink, storage, circuit board, etc.

In an embodiment, the portable computer comprises at least one card, with the at least one card comprising at least one connector which connects to at least one reader for interacting with the reader and storage. The portable computer excludes means for a user to interact directly with the portable computer independent of the reader. The at least one reader facilitates direct user interaction with the portable computer, with the portable computer configured to be inoperable unless connected to the at least one reader. The at least one card of the portable computer being no larger than 100 mm by 60 mm and being no thicker than 6 mm thick, and comprises all of the components of a fully functional general purpose computer. In a further embodiment, the at least one card is no larger than 95 mm by 55 mm and is no thicker than 5 mm. In a further embodiment, the portable computer is configured so that it will not operate with a reader other than the at least one reader. In a further embodiment, the portable computer is configured so that it will operate with a reader other than the at least one reader. In a further embodiment, the at least one reader is associated with at least one of a television (TV), a kiosk, a digital signage, an automobile, an appliance, a personal computer, a server, and a data center.

In another embodiment, the portable computer is a card and the portable computer reader is a card reader, as set forth in Applicant's U.S. Pat. No. 7,472,275 ("the '275 patent"). The card may be of any desired size and thickness, which may also be attributed to desired capabilities and technologies used, such as memory/storage requirements. As noted above, in certain embodiments, the card is preferably the size of a conventional credit card for easy transport. In addition, storage capabilities of the card can range according to the particular application for the portable computer. Current technologies would readily accommodate a gigabyte plus on the card and it is anticipated that a terabyte or more would also be capable of residing on the card. The card and reader may communicate using any of the means described above, such as over a cellular network. For example, the card and/or reader may incorporate the requisite components necessary to communicate over a cellular network. Alternatively, the card and/or reader may be connected to a cell phone either via a hard-wire connection or a wireless connection. The cell phone with card may then be used for full general computing functions such as accessing the internet, e-mail, word processing, etc. In this embodiment, the card and reader together comprise all of the elements of a fully functioning general purpose computer. In another embodiment, the card may be used in a card reader, which has a built-in camera. The reader, with the card, is able to access the internet to download music, movies, television shows, etc. The reader also may include a GPS system and biometric scanners or readers. Where the reader includes a biometric reader, it sends the biometric data to the portable computer for later processing and comparison. Preferably, the card has software that "times-out" the downloaded programs and, therefore, makes them unusable after a certain period of time. For example, a user may be able to download a movie and then will have a certain period of time in which to view the movie. Once that time expires, or when the user has viewed the movie, it will automatically be deleted from the card, reader or phone. In another embodiment, the user is able to download pre-paid calling minutes to the system. Similarly, the system is capable of automatically deleting any downloaded items if the user violates pre-set terms.

In one embodiment, the computer and portable computer reader form a memory device, such as the identification card described in Applicant's U.S. Pat. No. 7,139,914 ("the '914 patent") and '275 patent, which are incorporated by reference herein, in their entireties. A separate reader, such as those described in the '914 patent and '275 patent, may be used to read the information on the identification card. For example, the portable computer may have electronic files that store personal and biometric information. The reader is configured to read the biometric information stored on the portable computer. The portable computer may also comprise a GPS system or location system that may communicate by wireless means with a reader in the form of a scanner, when the card is brought into proximity with the scanner, as described in the '914 patent and '275 patent. Information may also be transferred from the identification card (portable computer and the portable computer reader), as described in the '914 patent and '275 patent.

In another embodiment, once the portable computer is connected to the portable computer reader, the system becomes a personal digital voice recorder for persons, including but not limited to medical patients and children. In this embodiment, the recorder stores real time voice data, such as non-volatile memory. Recording may start at any desired times, such as by a parent, utilizing the playback/send unit. The recorder may then be attached to a user, such as a child or patient, and all proximity sound to the child or patient is recorded until either a low power condition or a memory full condition is reached. The memory may be scalable according to the amount of recording time and fidelity desired by the parent or authorized custodial person.

In another embodiment, once the portable computer is connected to the portable computer reader, the system becomes an automatic voice notebook, such as for health care professionals on rounds, as an example. Similar uses, such as by building inspectors, maintenance, or security and military personnel, as an example, are also anticipated. In this embodiment, memory, such as non-removable, non-volatile memory, such as flash memory, may be used to store encrypted digital data in the record unit. A small cell may be used in this unit to keep size and weight to a minimum. A real-time clock may be embedded in the record unit to be used for time-stamping the recorded voice segments. The record unit may have a connector, such as along its bottom surface, which interfaces with a separate playback unit, such as when the record unit is inserted into a recessed opening in its top surface. The playback unit may include conventional features, such as speaker, play button, volume control, and "forward/reverse" switch for navigating within the data. Both the record unit and the playback unit may further have identifying features, such as matching bar codes on their housings, which can be used to identify the individual units in case of loss or to confirm identity.

In another embodiment, the portable computer can operate as a backup system to a conventional computer. For example, the portable computer may be connected via a portable computer reader or other wired or wireless connector, such as a USB or FireWire port, to the conventional computer, in order to upload data and other information stored on the conventional computer. In addition, in other embodiments, the portable computer may operate as a primary computing system when connected to a portable computer reader, such as a shell comprising a monitor and keyboard. In still other embodiments, the portable computer may be switched as desired between operating as a backup system or as a primary computing system, as described above. Further, in these and other embodiments, information stored on the portable computer may be downloaded onto another computing system where desired when connected to the portable computer, such as via the USB or FireWire port described above, or any other wired or wireless means.

In the operation of one embodiment, a user connects a card reader/writer to his or her home or office computer. This is a fully functional computer as in known in the art. The user then inserts a "blank" or new portable computer (for example, Computer "A," "B," or "C") into the card reader/writer. Through application software, the user then is prompted to download virtually all information from the home or office computer onto the portable computer. This includes all programs, operating system, etc. The user is then prompted to provide identifying biometric information such as a fingerprint or retinal scan. This "baseline" information is stored in the portable computer's memory such that only a user with a match of such information may interact with the portable computer. A user is then able to remove the portable computer and take it with him or her. The user then may connect the portable computer with the portable computer reader, which, as provided above is a shell until the portable computer is connected. Once the portable computer is connected to the portable computer reader, the reader automatically searches for the computer. Once it finds the computer, the user must log-on by inputting biometric information. If the information matches, the user is able to interact with the portable computer. Thus, the present disclosure allows a user to securely use his or her computer virtually anywhere.

The present system provides many advantages. First, because the portable computer is capable of being operated on almost any portable computer reader, it allows a user to transport essentially an entire computer easily for use anywhere. For example, the portable computer may be the size of a credit card, so as to be easily carried in a user's pocket or wallet. And, as provided, the portable computer is capable of performing virtually any computing function once connected to the portable computer reader. Thus, various embodiments of the present disclosure is not dependent upon a chassis for computing functions such as data retrieval, operating software application, software and video interface. Rather, all of these functions and applications are contained on the portable computer. Examples of the present disclosure contains all of the storage, processing, video interface and software in the portable computer which allows it to be used with any housing without concern for the version of operating software, application software or video setting. A user can easily carry the portable computer, place within or attach it to a portable computer reader, and then compute as is known in the art. This may include accessing the internet, e-mail, drafting and saving documents, sending and receiving all types of data, including pictures, video and text, etc. For example, the portable computer reader may comprise the required software and hardware for accessing the internet, such as modem and Internet Protocol ("IP") address. In other embodiments, these devices may be provided on the portable computer. An advantage of various embodiments is that many hardware and software components that are required for conventional computer operation can be contained within the portable computer reader, which enables the portable computer to contain minimal components, which benefits in that the portable computer can be small in size, economical to produce and durable. The portable computer acts as the brain and the portable computer reader operates as the body which will perform the functions. However, without the brain, the body will do nothing. When the user is finished computing, he or she simply removes the portable device and can take it with him or her. Because the portable computer reader is a shell, none of the user's information is left behind. Thus, various embodiments of the present disclosure do not make any information, including sensitive information, available to subsequent users of the shell computer. In addition, there is virtually no danger that the portable computer reader could be affected by a computer virus for this same reason, as there is no capability for the portable computer reader to retain any data from a previous person's use. As a result, the applications for the portable computer are almost limitless where security and privacy of content is a concern, and where there may be concern of corruption by viruses or worms. For example, applications include, but are not limited to, hotels, internet cafes or other public locations, such as libraries or universities, etc. Further, the various embodiments of the present disclosure provide the portability of a "Pocket PC" with the advantages of a traditional computer. For example, the portable computer is easily transportable and the portable computer reader provides use of a full computer such as a full-sized screen, larger keyboard, etc. that are not available with traditional Pocket PC-type computers. Finally, there is substantially no boot-up time with various embodiments of the present disclosure, due to the arrangement and/or nature of technology utilized. For instance, in certain embodiments, the portable computer may comprise one or more flash memory devices or flash drives. A flash drive is a storage device that uses flash memory rather than conventional spinning platters to store data. The flash drives tend to physically imitate conventional hard drives in performance. The motivation to call it a "drive" comes from the fact that it is serving the purpose of a part that has traditionally been mechanically driven. However, note that nothing is being mechanically driven in a flash drive. Advantages of using flash memory or flash drives with the portable computer is there is little delay time when starting up, in contrast to booting conventional computers, whose drivers take time to load and whose various hardware and software components are checked before being operable by a user. Also, flash memory is non-volatile, which means that it does not need power to maintain the information stored in the device, and as a result, the portable computer in many embodiments requires only low power for operation, which can be readily supplied by batteries 277 or similar low power sources, such as solar cells. The flash memory can also be tailored to provide as much storage capacity as may be desired depending on the particular application.

In addition, as various embodiments of the portable computer can be comprised of minimal components, since the portable computer reader would take up the remainder of the components, such as the monitor and keyboard of a shell computer referenced above, the costs of the portable computer would be greatly reduced over the costs of conventional computing systems. Moreover, use of cost-efficient technologies, such as flash memory, can further reduce the costs of the portable computer. As a result, the portable computer in certain embodiments may be viewed as a disposable device due to the cost efficiencies. Also, the small size would result in the device being more environmentally friendly even if disposable as compared to conventional computers. In other embodiments, due to the cost efficiencies, businesses can utilize the portable computer as promotional items, which are provided to users at no cost, or provided to a user who may purchase a related product, such as operating system software, i.e. Windows, or for subscribing to a designated service, such as an internet service provider. In these embodiments, the portable computer reader, i.e. the monitor/keyboard or reader, can be supplied by the business for use with the portable computer or purchased by the user. In addition, in other examples, portable computers may be provided at no or minimal charge to students or employees, who would be able then to use the portable computer with portable computer readers located at designated areas provided by the school, university, business or government, as examples.

Turning now to a discussion of method of using a computing system of the present disclosure, the computing system may have one or more readers and at least one portable computer configured to interact with the one or more readers. The method may comprise: providing the at least one portable computer comprising a length L, a width W and a height H, where L is in a range between about 50 mm to about 200 mm, W is in a range between about 25 mm to about 100 mm and H is in a range between about 1 mm to about 20 mm. The at least one portable computer comprises all of the components of a fully functional general purpose computer and that excludes an input and output device. The at least one portable computer being configured so that a user cannot interact with the at least one portable computer unless the at least one portable computer is connected to the one or more readers. The method may also comprise providing at least one reader having an input and output device for interacting with the at least one portable computer; connecting the portable computer to the at least one reader, where the at least one portable computer become a substantially fully functional general purpose computer when connected with the at least one reader; interacting with the at least one portable computer via the input and output device of the at least one reader; and disconnecting the at least one portable computer from the at least one reader.

The method may further comprise providing security information if the at least one reader identifies the portable computer, where the portable computer and the at least one reader may determine if the security information is accurate, and, if the security information is accurate, the method may include interacting with the portable computer via the at least one reader. In a further embodiment, the method may further comprise providing a biometric device for verifying an identity of the user of the portable computer when connected to the at least one reader; providing a GPS device for identifying location of at least one of the portable computer or the at least one reader; providing an operating system for use when the portable computer is connected to the at least one reader; and providing communication over the internet when the portable computer is connected to the at least one reader.

The system and method may further comprise a "one size fits all" approach. For example, the portable computer may be designed so as to be compatible with any desired number of devices; for instance, designed to be operable with a family of devices. In this arrangement, the portable computer may be readily changed between approved devices in the family but inoperable with others. For example, as set forth above, such family of devices may include, without limitation, other computers, televisions (TV's), monitors, kiosks, digital signage, automobiles, appliances, such as washers, dryers, refrigerators, etc., personal computers, servers, data centers, mobile data centers, keyboards, displays, touch screens, computer mice, speakers, phones, desktop docks, all-in-one monitors, hard drives, optical drives, CDs, DVDs, BlueRay™ players, flash memory, floppy disks, magnetic tape, paper tape, standalone RAM disks. ZIP drives, GPSs, biometric scanners or readers, cable set top boxes, cameras, etc. In this manner, the portable computer may be designed so as to be inoperable with devices outside the approved family of devices. In a similar manner the reader and other devices may also be made compatible with similar functional constraints as the portable computer. In certain examples, the portable computer and/or reader/other devices may be designed so as to be capable with other designated families.

The system and method may further comprise the capability to upgrade. For example, each new generation of portable computer may be designed so as to be compatible with older generations of readers and other devices in which such older generations of portable computer had been compatible with. This would provide the advantage of seamless upgrade without compromising any operability. Of course, where desired, the portable computer may be designed so that it is only compatible with certain product releases of reader and other devices. The same upgrade capability may also occur with respect to the reader and other devices.

Figure 11:
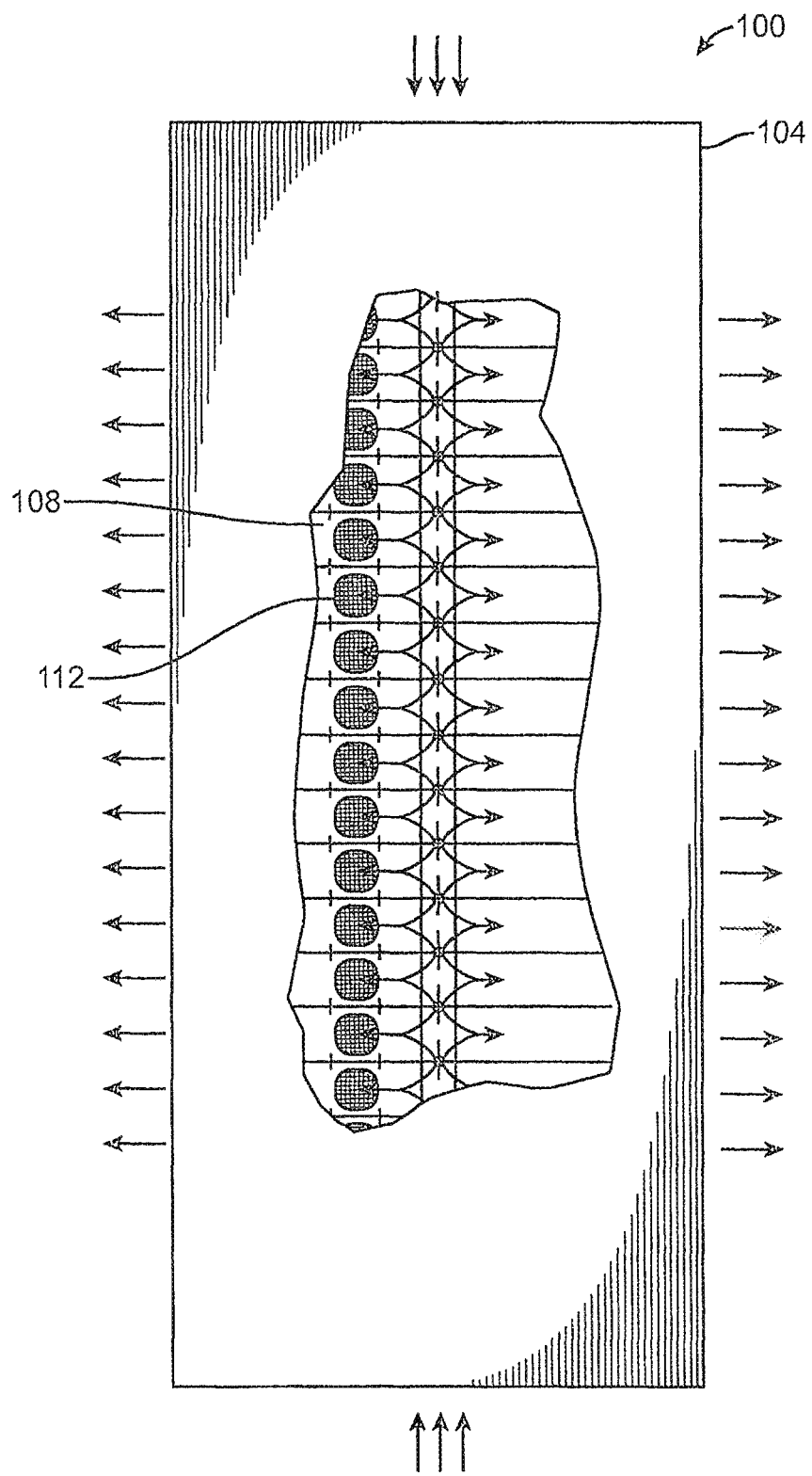
FIG. 11 is a prior art industry standard server.

As noted above, two or more portable computers 10 may be connected together. This configuration of portable computers 10, designed and configured as discussed above, allows for the creation of high density servers with low power usage and low cooling requirements. The high density servers using portable computers 10 as discussed herein are a significant advancement over prior art servers, such as server 100 shown in FIG. 11, which have a number of drawbacks. For example, the server modules within the server racks of server 100 demand significant cooling and power requirements. Traditional servers, such as server 100 of FIG. 11, typically reside in a climate controlled room and include multiple cooling systems to move air through the server rack 104—most often inputting air through the top and bottom of the server rack and out horizontally as shown in FIG. 11. Further, each server module 108 typically includes its own individual active cooling mechanism 112, e.g., a fan, and generally also includes passive cooling too, e.g., a finned heat sink. Understandably, the floating-point operations per second (flops) for a given server volume flops/cu ft) is inherently limited by the size of the server module, the power requirements of the server modules, and the cooling of the server modules achievable. In essence, more powerful servers require more power and thus generate more heat, which necessitates more cooling.

Figure 12A:
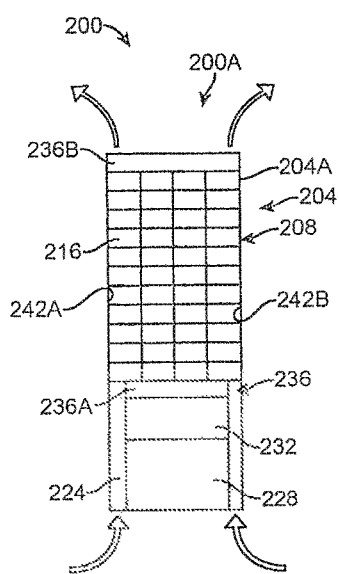
FIG. 12A is a plan view of a high density server according to an embodiment of the present disclosure.
Figure 12B:
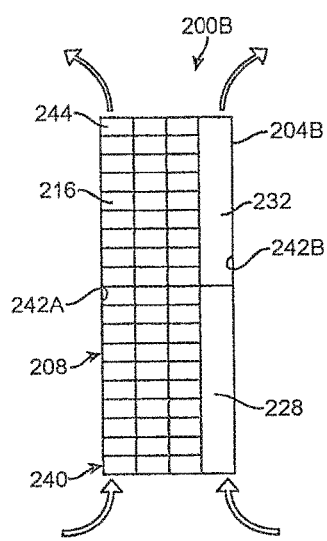
FIG. 12B is another plan view of an alternative high density server according to an embodiment of the present disclosure.
Figure 12C:
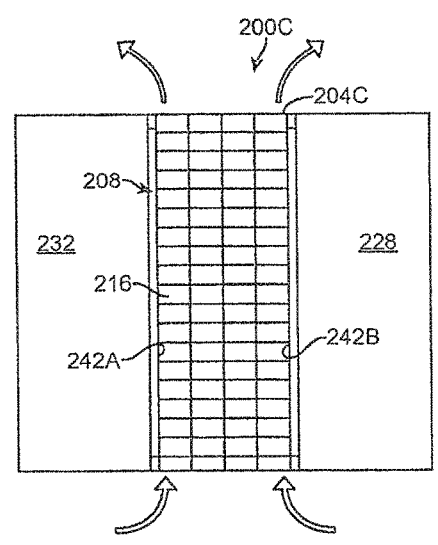
FIG. 12C is yet another plan view of an alternative high density server according to an embodiment of the present disclosure.

Turning now to FIGS. 12A-C, three different embodiments of high density servers (HDS) 200, HDS 200A-C, are shown. Each HDS 200A-C includes a server rack 204A-C, which may be an industry standard server rack or can be a server rack that is sized and configured to accept the components of HDS 200 as set forth below. An industry standard server rack has a standard spacing of internal support structures or coupling members. The standard spacing in an industry standard server rack is referred to a standard rack unit or "U." An industry standard server rack has 42 U and has dimensions of 78.5 inches by 24.0 inches by 42 inches.

Server rack 204 includes a plurality of shelves 208 that may be slidably mounted within the server rack such that the shelves may be fully or partially withdrawn from the server rack. As discussed in more detail below with reference to FIGS. 13-16, each shelf 208 includes one or more drawers 216 with one or more portable devices 220 (FIG. 14), which can be the same as, or similar to, portable computer 10, and may be coupled to each of the one or more drawers.

HDS 200A, as shown in FIG. 12A, includes one or more air flow channels 224 that pass other components stored within server rack 204, such as a power module 228 and a connectivity module 232. Air flow channels 224 act as conduits for ambient air to pass through and around shelves 208, and consequently around portable computers 220 positioned within the shelves. In an exemplary embodiment, HDS 200A also includes a lower air distribution module 236A and an upper air distribution module 236B, which work in conjunction to move air vertically through server rack 204. Distribution modules 236 are typically fans that are designed to pull outside air into server 100 or remove air from server 100 as desired. In another exemplary embodiment, only one of air distribution modules 236 is included.

HDS 200B, as shown in FIG. 12B, arranges power module 228 and connectivity module 232 in a stacked relationship adjacent to shelves 208. In this embodiment, use of air distribution modules 236 may not be necessary, as ambient air may naturally travel through a lower portion 240 of HDS 200B and exit through an upper portion 244 of the HDS. The natural air flow is induced by the heat generated by portable devices 220, but, and as described elsewhere herein, the design of the portable devices, drawers 216, shelves 208, and server rack 204 is such that a naturally convective airflow can provide sufficient cooling. In an exemplary embodiment, HDS 200B does not include a bottom in lower portion 240 or a top in upper portion 244. In an alternative embodiment, the amount of air that flows through HDS 200B can be controlled by louvers (not shown) mounted in either lower portion 240, upper portion 244, or both. In this embodiment, when the louvers are in a substantially open position, air flow is substantially unimpeded. In yet another alternative embodiment, HDS 200B may have a grate style bottom and/or top that allows air to pass through the HDS substantially unimpeded.

FIG. 12C shows yet another embodiment of HDS 200, HDS 200C. In this embodiment, power module 228 and connectivity module 232 reside in an opposing parallel relationship on either side of shelves 208. As with HDS 200B, HDS 200C may rely on natural airflow to cool portable devices 220 disposed therein. Also, as with HDS 200B, HDS 200C may have a lower portion 240 and an upper portion 244 that are similar to those described above.

In an exemplary embodiment, HDS 200 is enclosed on its four vertical sides so as to promote air flow entering from the bottom and exiting from the top of the HDS. Opposing parallel vertical sides, e.g., 242A-B, can include equally spaced support or coupling mechanisms for receiving one or more shelves 208 as set forth in more detail below.

Figure 13:
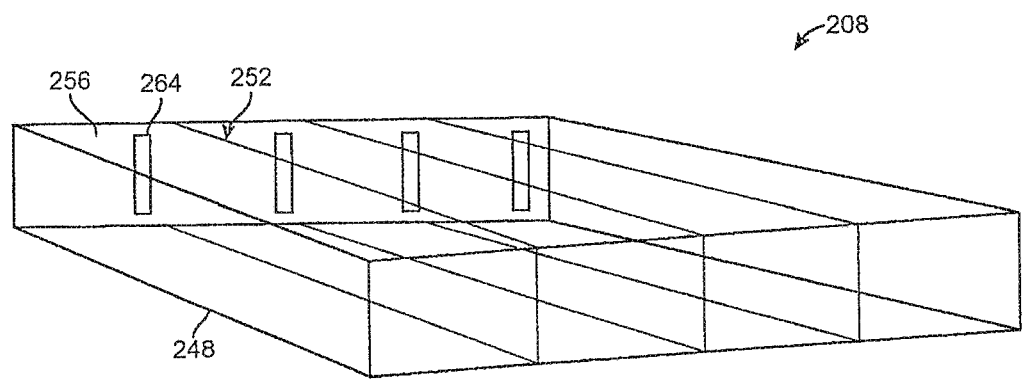
FIG. 13 is a perspective view of a shelf for a high density server according to an embodiment of the present disclosure.
Figure 14:
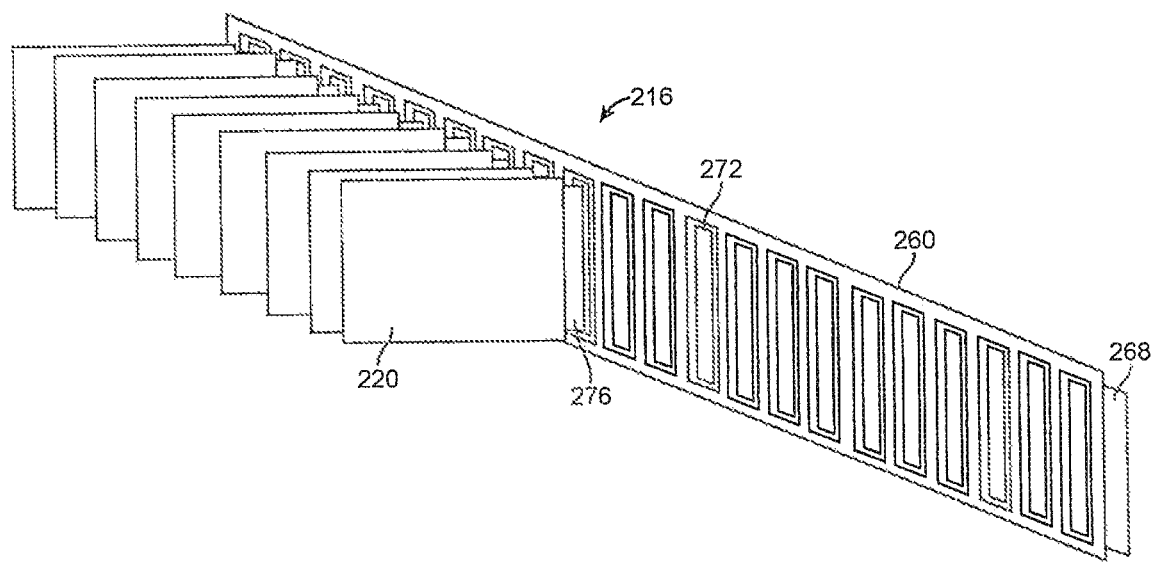
FIG. 14 is a perspective view of a drawer for a high density server according to an embodiment of the present disclosure.

Turning now to the internal structures of an exemplary HDS 200, with reference to FIGS. 13-14, FIG. 13 shows an exemplary embodiment of shelf 208. Shelf 208 has a generally rectangular support structure 248 and includes a plurality of rails 252 extending away from a motherboard 256. Support structure 248 may slidably engage the sides of HDS 200, such that the shelf 208 may be fully or partially removed from the HDS. Rails 252 effectively divide shelf 208 into substantially parallel rectangular prisms that are sized and configured to accept a drawer 216 (FIG. 14) having one or more portable computers 220. As with shelf 208, each rail 252 may slidably receive a drawer 216 so that the drawer may be fully or partially removed from shelf 208 (best seen in FIG. 15). If installed in a traditional server rack, such as server rack 104, in an exemplary embodiment shelf 208 uses about two standard rack units or "U" within the server rack.

Motherboard 256 (FIG. 13) carries power and connectivity (e.g., an Ethernet connection) to each drawer 216, which in turn uses a backplane 260 (FIG. 14) to carry power and connectivity to each individual portable device 220 (FIG. 14). In an exemplary embodiment, motherboard 256 includes a plurality of receiving ports 264 (four shown in FIG. 13 for ease of representation; more receiving ports may be included), that receive a corresponding electrical connection 268 (FIG. 14) associated with backplane 260. Motherboard 256 also includes one or more electrical connectors (not shown) to electrically couple to other motherboards associated with other shelves 208 installed within HDS 200. In an exemplary embodiment, motherboard 256 is a multi-layered power and connectivity distribution module, similar to the multilayered motherboards described previously. In this embodiment, individual layers or threads within the motherboard 256 replace the traditional power and network (e.g., Ethernet) port connections that would be used to connect server modules within industry standard server rack 104.

As shown in FIG. 14, drawers 216 include a backplane 260 to which a plurality of portable devices 220 may be coupled, Backplane 260 has, in one embodiment, a plurality of elongated connection slots 272 that are orientated with their long dimension orthogonal to the longitudinal axis of the backplane. Each connection slot 272 is sized and configured to accept a corresponding connector 276 from a portable device 220. While the number of connection slots 272 may vary depending on the needs of the user, in an exemplary embodiment, backplane 260 includes about 50 connection slots.

Figure 15:
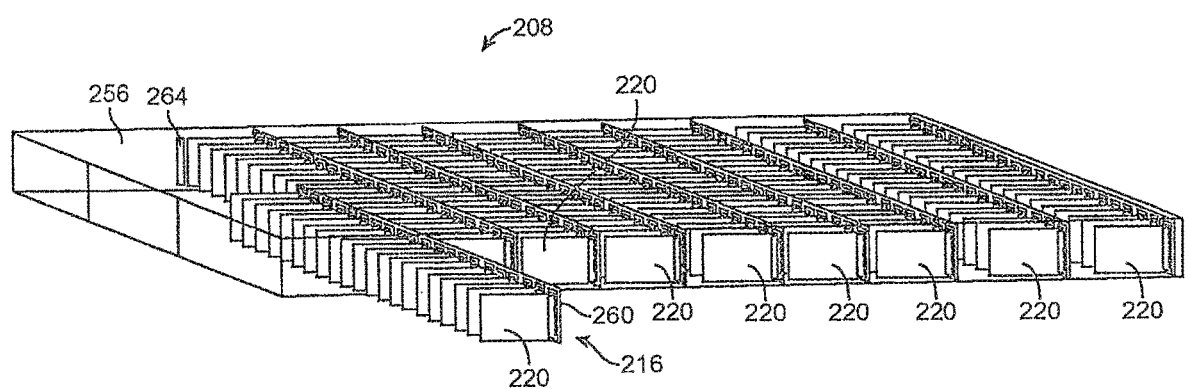
FIG. 15 is a perspective view of multiple drawers inserted into a shelf for a high density server.
Figure 16:
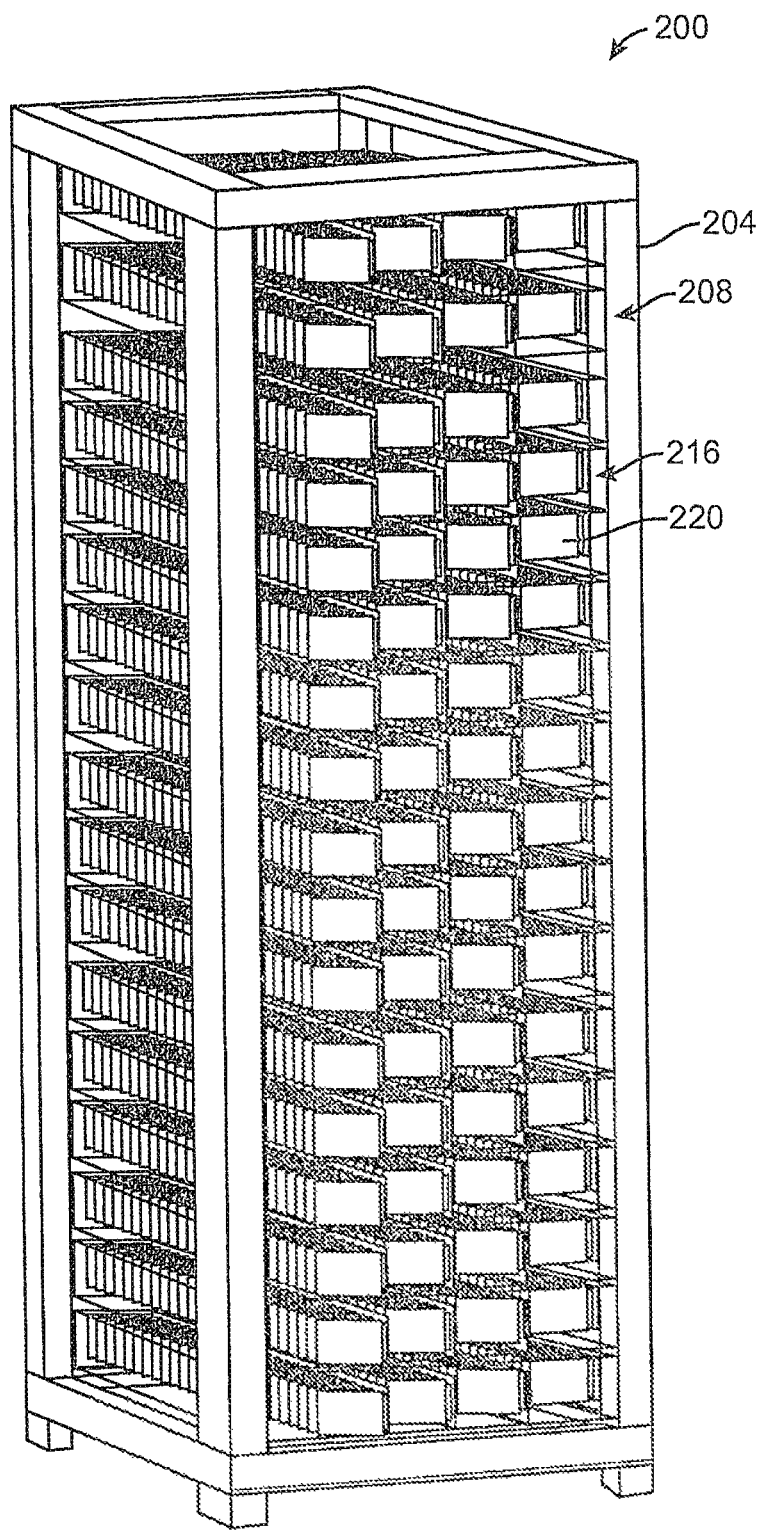
FIG. 16 is another perspective view of a high density server according to an embodiment of the present disclosure.

In use, and as shown in FIGS. 15 and 16, each drawer 216 is slid into a shelf 208 along a plurality of rails 252 on the shelf being positioned to align the electrical connection 268 from backplane 260 with a receiving port 264 in motherboard 256. Then shelf 208 is inserted into server rack 204. As shown, portable devices 220 are positioned in a substantially vertical position, meaning that the major plane of the portable device is substantially orthogonal with respect to the floor and the shortest side (i.e., the edge) is substantially parallel to the floor. This orientation, when coupled with the open design of drawers 216 and shelves 208 allows for substantially unimpeded airflow from the bottom of server rack 204, over and around all portable devices 220 in the server rack, and out the top of the server rack.

HDS 200 has a computing density, i.e., flops/volume, that is substantially greater than a traditional server. HDS 200 also uses less power per computing unit (e.g., flop) and creates less heat per computing unit than a traditional server. In an exemplary embodiment, HDS 200 uses less than 90% of the footprint of a traditional server of similar computing power. In another exemplary embodiment, HDS 200 uses less than 50% of the footprint of a traditional server of similar computing power. In yet another exemplary embodiment, HDS 200 uses less than 90% of the power of a state-of-the-art server with similar computing power. In a further exemplary embodiment, HDS 200 uses less than 30% of the power of a state-of-the art server with similar computing power. Given the lower power usage of HDS 200 when compared to a traditional server of similar computing power, the amount of heat generated will be significantly less, thereby facilitating the embodiments of HDS 200 discussed above that use little or no active cooling mechanisms, such as fans.

Consistent with the discussions of the portable computer 10 above, each portable device 220 can include a processor or CPU and memory, a mass storage device such as a hard disk drive, and input/output ports. Thus, the computing capacity of HDS 200 may be easily expanded by coupling additional portable devices 220 into empty drawers 216. In an exemplary embodiment, portable device 220 includes, among other parts, a processor, such as, but not limited to, an Intel Atom Z550 or a X86, with Controller, DRAM, and SSD. Portable device 220 may be tailored to run Windows 7, a Linux-based operating system, or other operating systems as desired.

Moreover, two or more HDS 200 may be coupled together to form a larger system that can share an uplink, a load balancer, and/or a router to connect to a network, such as the Internet. An expansion module (not shown) may be included with one or more drawers 216 or shelves 208. Expansion modules may include extra storage, another processor, or other hardware components that enhance the functionality of individual portable devices 220 and/or the HDS 200 in which the portable devices are mounted. For example, expansion modules may include, without limitation, a GPS device, a graphics card, a sound card, a network card, a heat sink, a memory, and a circuit board. Local and/or remote management nodes or workstations may be provided to permit access to HDS 200.

In an alternative embodiment, each portable device 220 can include a separate bus structure that is suitable for coupling multiple portable computers together with a connector, housing, or other suitable apparatus, so as to enable communication between portable devices 220 and to facilitate the creation of a HDS 200.

In a further exemplary aspect of the present disclosure, an expansible server rack comprises: parallel opposing sides, a rear panel, a top, and a bottom; a plurality of shelves each having a connector for electronically coupling to the rear panel and having a plurality of connecting slots, wherein each of the plurality of shelves is slidably engaged with the parallel opposing sides so as to be removable from the expansible server rack; a plurality of drawers each having a backplane with a connecting portion for electronically coupling to a respective one of the plurality of connecting slots; a plurality of portable devices electronically coupled to the backplane, wherein each of the plurality of portable devices is disposed on a corresponding respective one of the plurality of drawers in parallel relation to the opposing sides so as to promote substantially unimpeded vertical airflow from the bottom to the top. Each of the plurality of portable devices can include: at least one printed circuit board containing at least one integrated circuit for storing data; and a single coating substantially covering the at least one integrated circuit. The single coating can operate to: inhibit tampering, as attempts to improperly gain access to the stored data will damage the at least one integrated circuit; dissipate heat generated by the at least one integrated circuit; and waterproof the at least one integrated circuit. The single coating can be selected from the group consisting of silicone, epoxy, acrylic, urethane, and paraxylene. Each of the plurality of portable devices may also or alternatively include: at least one storage component; a printed circuit board comprising at least one integrated circuit; a coating covering the at least one integrated circuit. At least one of the plurality of portable devices may include an operating system.

In another exemplary aspect, a high density server comprises: a server case having a rear panel, the server case including: a plurality of motherboards disposed on the rear panel; a plurality of drawers each having a backplane, plural ones of the plurality of drawers being removably coupled to a corresponding respective one of the plurality of motherboards; and a plurality of portable devices each having a communications port, wherein the backplane is a multilayered data and power transmission device that provides for data transmission to and from individual ones of the plurality of the portable devices and to and from the motherboard. The portable device may include: at least one printed circuit board containing at least one integrated circuit for storing data; and a single coating substantially covering the at least one integrated circuit. The single coating may operate to: inhibit tampering, as attempts to improperly gain access to the stored data will damage the at least one integrated circuit; dissipate heat generated by the at least one integrated circuit; and waterproof the at least one integrated circuit. The single coating may be selected from the group consisting of silicone, epoxy, acrylic, urethane, and paraxylene. The portable device may also or alternatively include: at least one storage component: a printed circuit board comprising at least one integrated circuit; a coating covering the at least one integrated circuit; and at least one connector adapted to connect to the backplane, The portable device may also include an operating system. The expandable server may further include an expansion module mounted to at least one of the plurality of drawers, the expansion module furthering the capabilities of the portable device. The portable device may be about 4 mm in height, about 83 mm in length, and about 52 mm in width.

In another alternative embodiment, multiple portable devices 220 may be coupled together to form a portable server for use in a moving vehicle. In this embodiment, portable devices 220 are coupled to a 12 volt power supply from the vehicle via a transformer or DC/DC converter, which reduces the 12 volt incoming power to the proper voltage for the portable devices, e.g., 5 volts. Portable devices 220 may be coupled together using, for example, a backplane, such as backplane 260, which may include an electric connector suitable for coupling to the automobile's power supply. As mentioned above, backplane 260 can have any number of connection slots 272 and need not have as many as shown in FIGS. 13-16. In an exemplary embodiment, the mobile portable server described just above has a backplane 260 with two or more connection slots 272. In another exemplary embodiment, the mobile portable server described just above has a backplane 260 with three connection slots 272.

Figure 17:
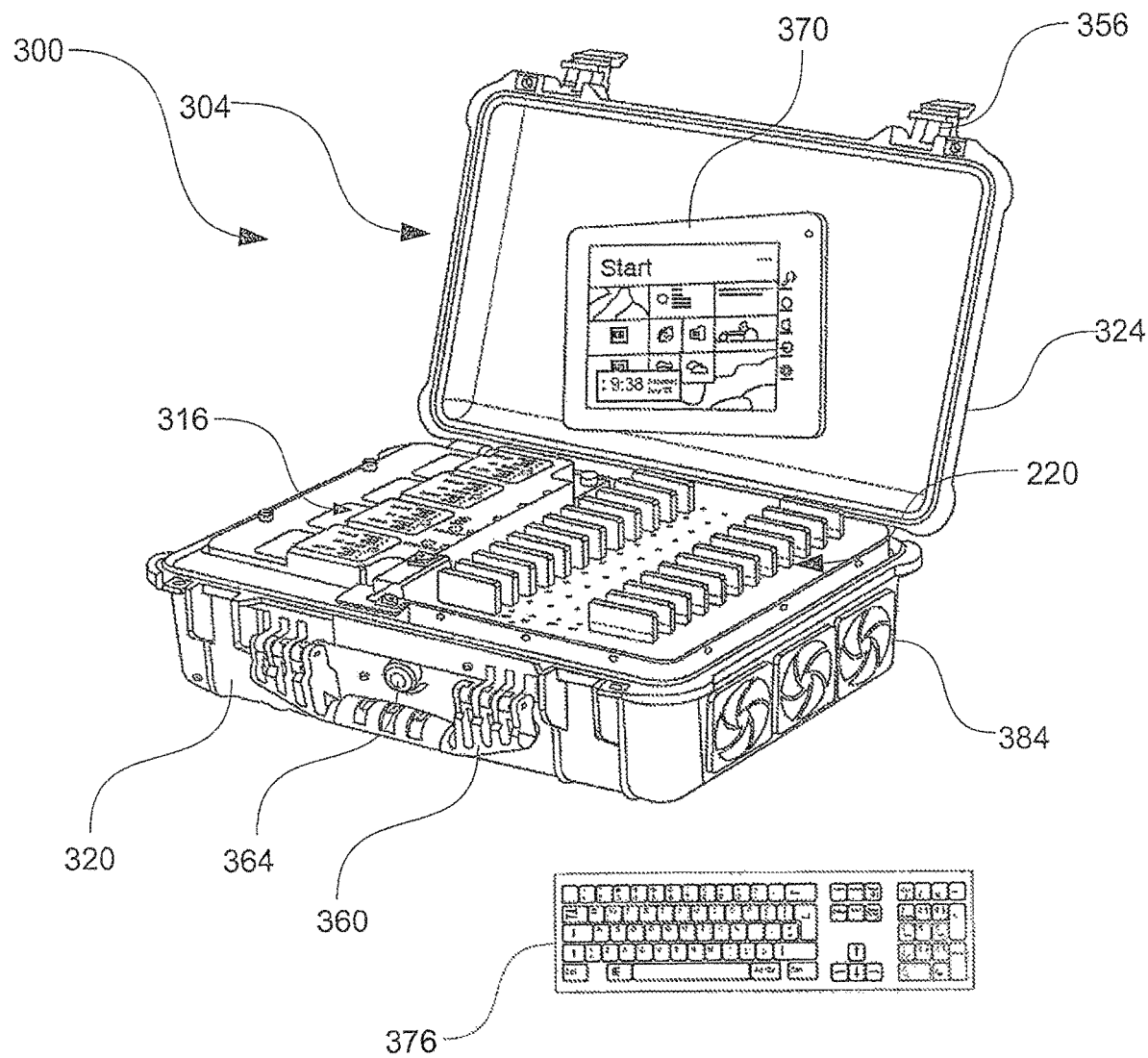
FIG. 17 is a perspective view of a portable mobile server according to an embodiment of the present disclosure.
Figure 18:
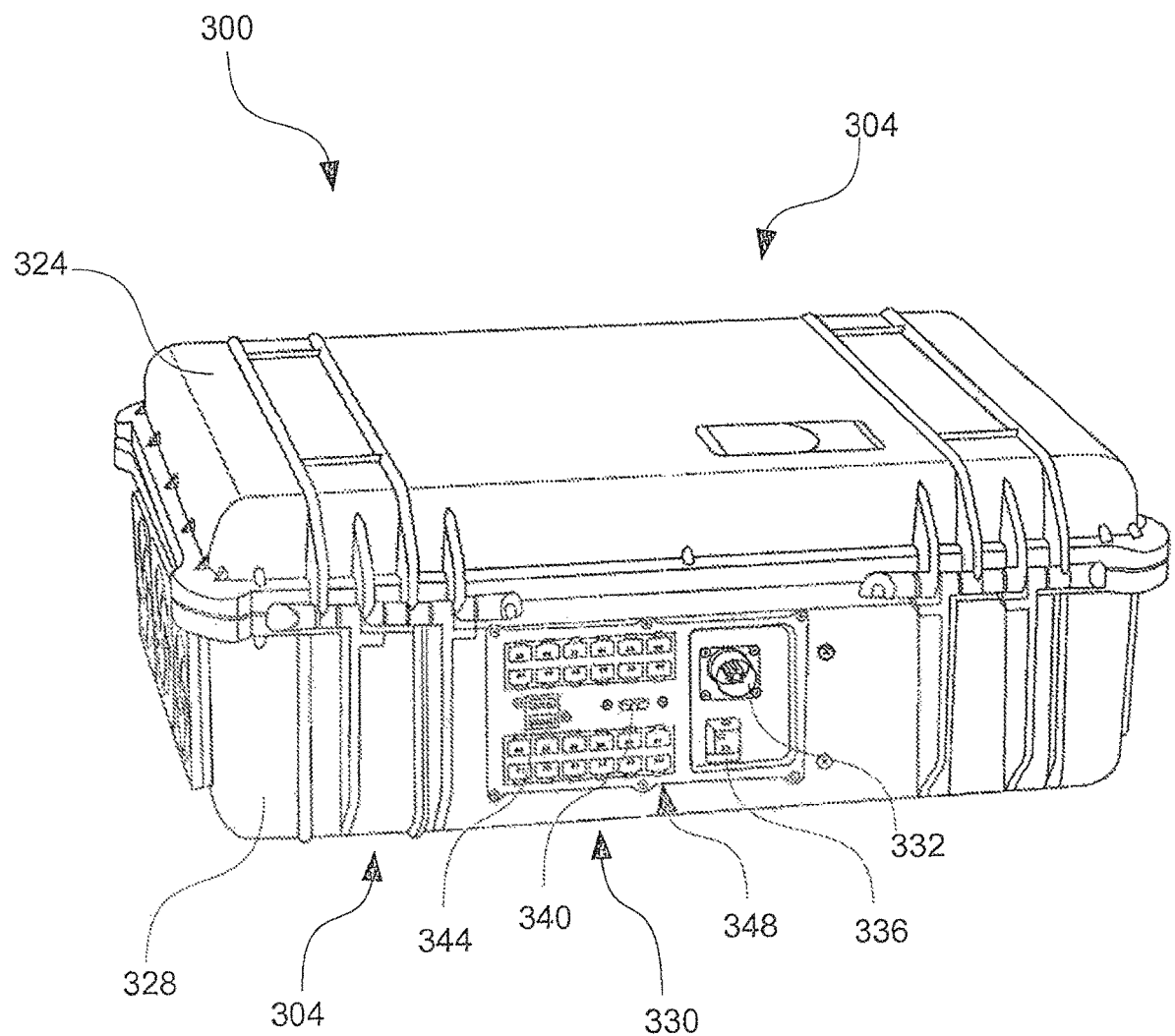
FIG. 18 is another perspective view of a portable mobile server according to an embodiment of the present disclosure.
Figure 19A:
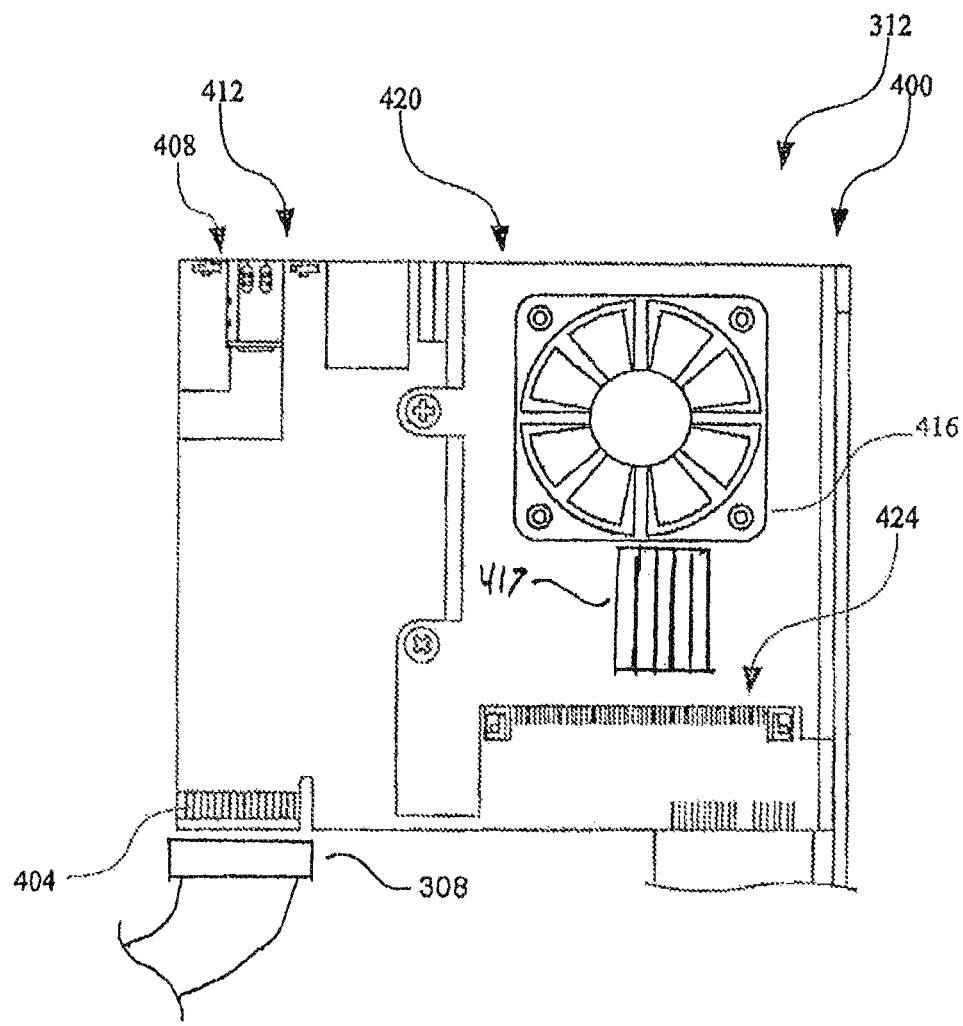
FIG. 19A is a plan view of a reader according to an embodiment of the present disclosure.
Figure 19B:
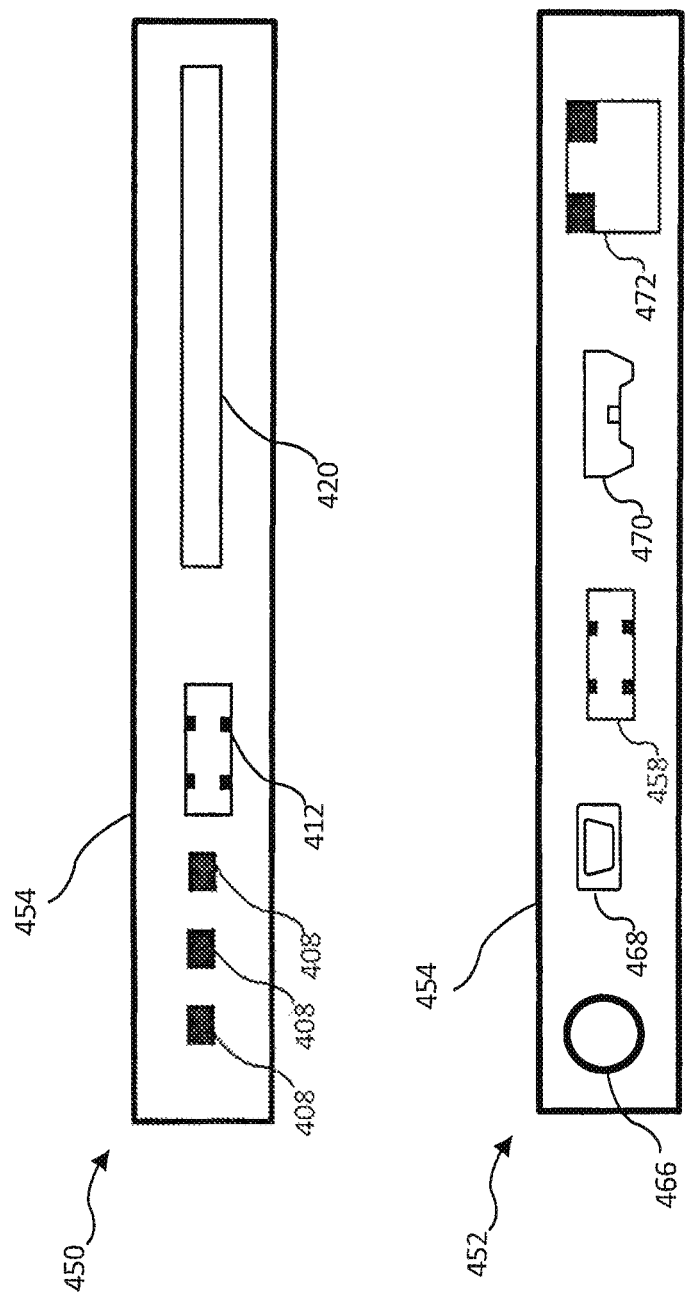
FIG. 19B is a view of a housing of a reader, according to an embodiment of the present disclosure.
Figure 20:
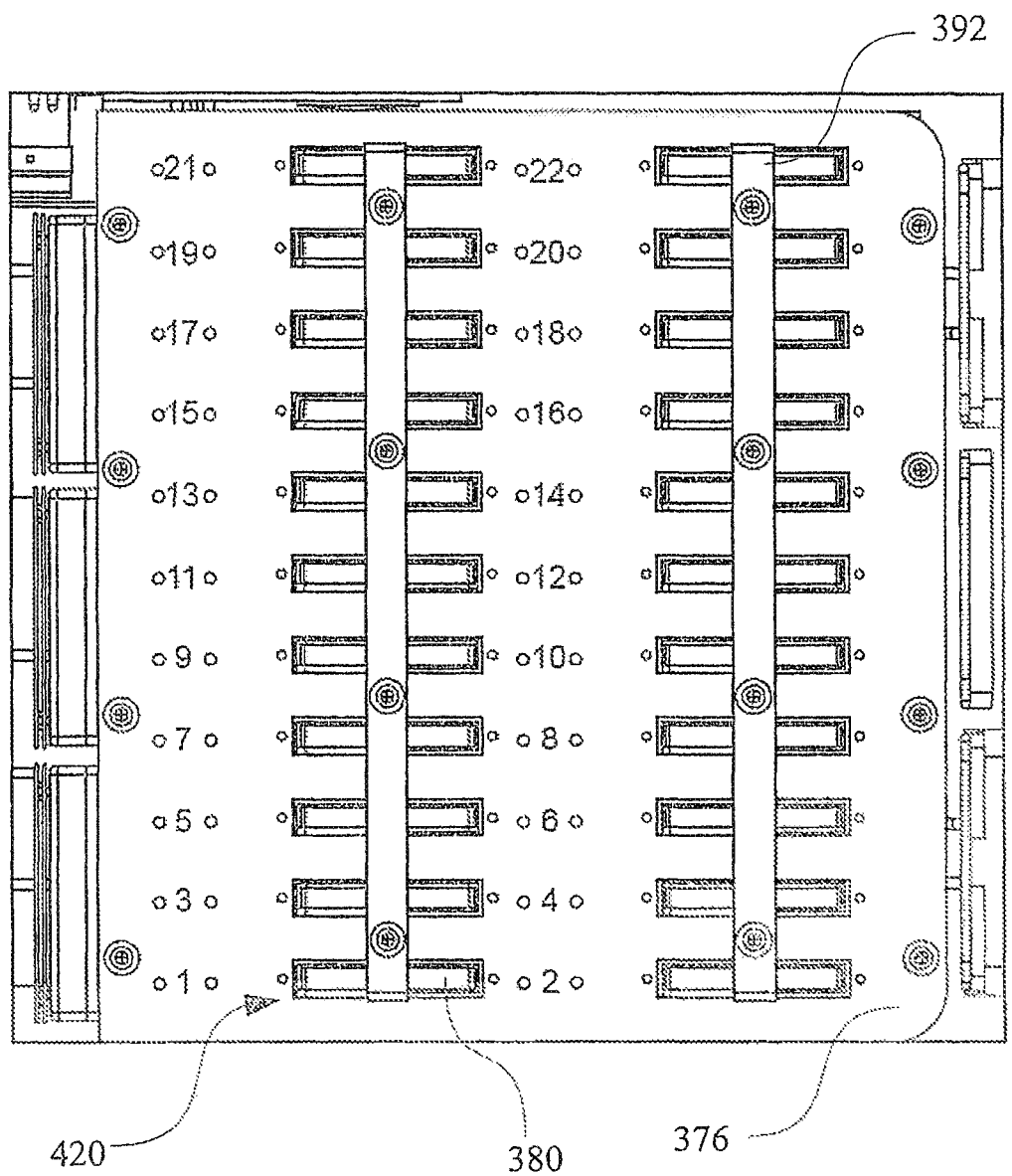
FIG. 20 is a plan view of a portion of the inside of a portable mobile server according to an embodiment of the present disclosure.

In another alternative embodiment, and as shown in FIGS. 17 and 18, and with further reference to FIGS. 19A-19B and 20, multiple portable computing devices 220 may be coupled together to form a portable and mobile deployable data center (DDC) 300. At a high level, DDC 300 includes a case 304, an interconnection mechanism 308, a plurality of readers 312 (best seen in FIG. 19A), a plurality of portable devices, such as portable devices 220, and a plurality of power supplies 316. Case 304 is typically configured to be a rugged enclosure capable of protecting the enclosed components from elements such as dust, shock, water, condensation, electromagnetic interference, and ingression of other potentially harmful elements. Case 304 can resemble a suitcase and is preferably capable of being carried or moved easily by a person without the assistance of a vehicle.

In an exemplary embodiment, case 304 includes a bottom portion 320 and a top portion 324. Bottom portion 320 is generally sized and configured to securely hold the internal computing components of the DDC 300, such as, but not limited to, readers 312. Bottom portion 320 also includes a plurality of connectors for interfacing with the internal components of the DDC 300. For example, and as shown in FIG. 18, a rear face 328 of bottom portion 320 can include several interfaces 330, such as, but not limited to, a DC power supply connector 332, an AC power supply connector 336, an HDMI connector 340, a USB connector 344, and an Ethernet connector 348. In a preferred embodiment, ingression protection from water, dust and other contaminants is provided through the use of connector covers 352.

Case 304 can also include latches 356 for securing the top portion 324 to the bottom portion 320, and can further include locks (not shown) on the latches to secure the contents of the case, gaskets (not shown) to prevent ingress between top and bottom portions, wheels (not shown) on the case to allow easy transportation of the case, and handle(s) 360 to carry the case. In an exemplary embodiment, case 304 also includes an air valve 364 that extends from the inside of the case to the outside and allows for the equalization of atmospheric air pressure inside the case. Case 304 may be constructed of any rugged material such as molded ABS plastic.

As discussed above, DDC 300 can include an interconnection mechanism 308. In general, interconnection mechanism 308 connects the components residing in and integrated with case 304, such as, for example, power supplies 316, readers 312, portable devices 220, and interfaces 330. Interconnection mechanism 308 can connect the components with case 304 through, for example, a discrete wiring method, a pre-fabricated wiring harness, or a distributed backplane (which may be similar to backplane 260). In an exemplary embodiment, interconnection mechanism 308 is attached to a bottom portion of case 304 and has a plurality of connectors (not shown) extending substantially perpendicular therefrom for attachment to one or more of readers 312 and/or power supplies 316. To improve the density/capacity of DDC 300, the connections disposed on interconnection mechanism 308 are disposed in a row/column arrangement (see e.g., FIG. 17) thus allowing for juxtaposition of one component (e.g., reader 312) next to another of said components (e.g., another reader).

As noted above interconnection mechanism 308 provides connections for various components of DDC 300, which includes readers 312. An exemplary embodiment of a reader 312, reader 400, is shown in FIG. 18. At a high level, reader 400 can be configured as described above and serves to couple a portable device 220 or a power supply 316 to interconnection mechanism 308. In this embodiment, reader 400 includes, but is not limited to, a reader connector 404, reader status indicators 408, I/O ports 412, a fan 416, and a slot 420 with a slot connector 424.

Reader 400 couples to interconnection mechanism 308 via a reader connector 404, which can be an edge type connector that preferably allows for each reader to be easily removed from DDC 300 for servicing, replacement, or exchange with another type of reader. In an exemplary embodiment, reader 400 is configured to be hot swappable, thus capable of being removed for servicing or replacement without the need to turn off power to the remaining readers installed within DDC 300. Once connected to interconnection mechanism 308, reader 400 allows the portable devices 220 coupled to it to interface to other devices by providing standard interface connector sockets for the various interfaces. Reader 400 can also convert a PCIe signal interface into a Ethernet interface using a converter chip such as those available from Intel or other manufacturers. Reader 400 can also include an RJ45 style connector and can be connected to the RJ45 style connectors using high speed Ethernet cabling such as category 6 cable or through the use of a PC board style backplane.

DDC 300 typically includes a plurality of portable computing devices, such as portable device 220, as described above. As discussed in more detail below, DDC 300 can include the hardware and software components required to configure one or more of portable devices 220 to act as a computing client, data server, a communications router, or a combination thereof. DDC 300 may be configured such that the portable computing devices are arranged within the deployable data center in rows and columns (seen in FIGS. 17 and 20), which can be laid out via a panel or cover 376 that includes channels 380 for inserting portable devices 220, readers 312/400, or combinations of the two.

As best seen in FIGS. 17 and 20, portable device 220 couples to reader 400 in slot 420. As shown in FIG. 19A, proximate the bottom of slot 420 is a slot connector 424 that mates with a similar connector on portable device 220. Although slot connector 424 is shown as a multi-pin connector in FIG. 19A, reader 400 and portable device 220 can connect together via a wireless interface, a backplane style connection, or via other methodologies known in the art. In the embodiment shown in FIG. 19A, reader 400 connects to portable computer 220 using a multi-pin connector that allows the portable computer and the reader to remain in the same geometric plane, in other words, the portable computer and the reader are adjacent to each other and have their respective major planes parallel to one another. In this parallel configuration, the reader may also pass through or lie adjacent to a slot in panel 376. Additionally, when oriented in a substantially parallel configuration, reader status indicators 408 and I/O ports 412 may be visible to the user and provide status information regarding the state of portable device 220 in slot 420 such as power status, computing status, interface status and other conditions.

I/O ports 412 can be, but are not limited to, a Universal Serial Bus (USB), a PC display port, and an HDMI port. Each I/O port 412 couples from reader 400 to interconnection mechanism 308, which can then be coupled to similar interfaces 330 (FIG. 17) on case 304. In another embodiment, I/O ports 412 can connected to a panel through cabling or a PC board backplane appropriate for carrying those signals to similar interfaces 330. In an exemplary embodiment, reader 400 includes a fan 416 and heat sink 417 disposed adjacent to portable computer 220 to assist in heat dissipation from the portable computer. Fans 416 provide airflow to cool portable device 220 and may have adjustable speeds as a function of the amount of airflow required to cool the portable device. So as to adjust the speed of fan 416, reader 400 and/or portable device 220 can include a temperature sensor (not shown), which provides a signal indicative of the temperature being measured and this can be used by the reader or portable device to adjust the fan speed and air flow. DDC 300 can also sense when portable device 220 is installed and activate its corresponding cooling fan 384 (FIG. 17). Portable device 220, as described above, can have a coating that assist in the dissipation of heat from the heat generating components through both conduction and convection methods. In an exemplary embodiment, air flow through case 304 enters through fans 384 and passes underneath each reader 400 and accelerates past each portable device 220 through each slot 420 with the assistance of fan 416 and then out to the exterior of the case via one or more exit fans or louvres (not shown).

FIG. 19B shows a front view 450 and a rear view 452 of reader housing 454. The front of reader housing 454 may include reader status indicators 408, I/O port 412, and slot 420. Slot 420 may accept portable computer 220. When portable computer 220 is fully inserted into slot 420, connector 276 of portable computer 220 may mate with connector 424 of reader 312 allowing portable computer 220 to interact with reader 312. The rear of reader housing 454 may include power connector 466, DisplayPort connector 468, USB connector 458, HDMI connector 470 and Ethernet connector 472.

In use, portable devices 220 can be individually inserted and removed in order to increase computing capacity or to reduce power consumption. As shown in FIG. 20, there are twenty-two slots 420 in this embodiment, with each slot configured to accept portable devices 220, although more or fewer slots and portable devices can be configured depending on the implementation. In an exemplary embodiment, each portable device 220 is secured a respective slots 420 through the use of a securing bar 392. Securing bar 392 is fastened to case 300 using multiple fasteners, such as thumbscrews, which allow easy removal of the securing bar by the user without the use of tools.

Figure 21A:
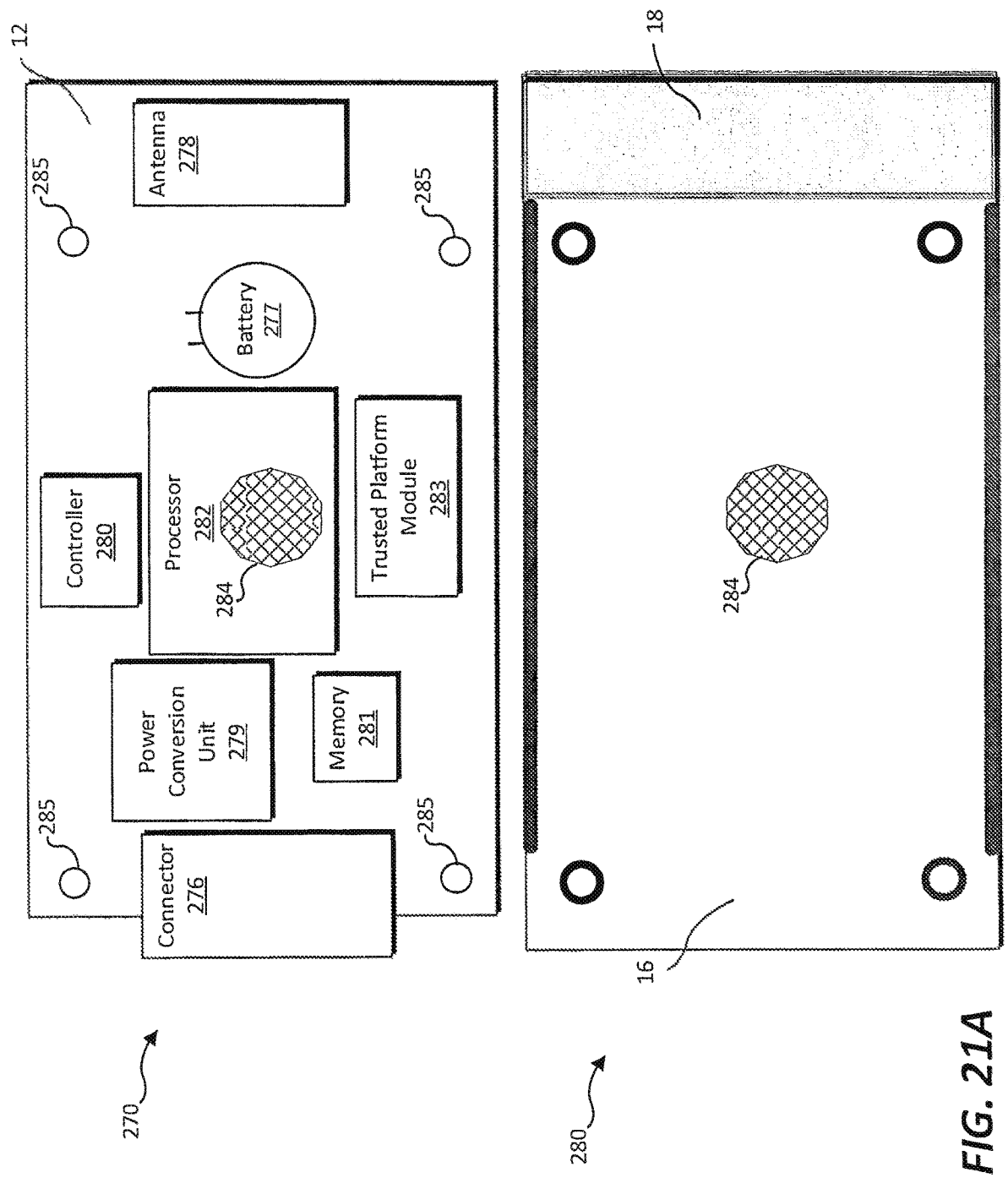
FIG. 21A is a plan view of components of a portable computer, according to an embodiment of the present disclosure.

Referring to FIG. 21A, portable computer 270 may include printed circuit board 12, connector 276, power conversion unit 279, memory 281, controller 280, processor 282, trusted platform module 283, battery 277, antenna 278, mounting screw holes 285, and thermally conductive element 284. Case 280 may be an enclosure for portable computer 270 and may include casing portions 16, 18 and thermally conductive element 284. In an embodiment of the present disclosure, case 280 may enclose portions of portable computer 270. Case 280 may provide physical protection and heat dissipation for portable computer 270. FIG. 21A shows an inner surface of case 280 disassembled from portable computer 270. When case 280 is assembled to portable computer 270 using mounting screw holes 285, thermally conductive element 284 provides a thermal conductivity path from a surface of processor 282 to the inner surface of case portion 16. Case portion 16 may include metal and provide thermal conductivity. Case portion 18 may include a rigid material such as a non-metal material.

Figure 21B:
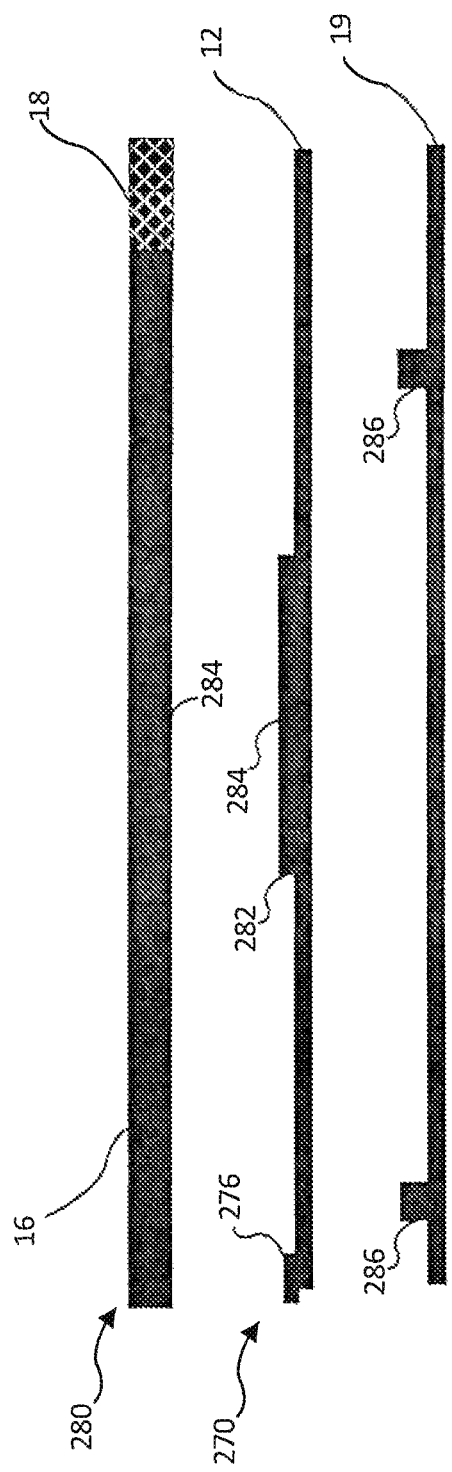
FIG. 21B is an expanded side view of a portable computer in a case, according to an embodiment of the present disclosure.

FIG. 21B shows an exploded side view of portable computer 270 and case 280. In an embodiment of the present disclosure, portable computer 270 may be enclosed in case portions 16, 18 and 19. Bottom case portion 19 may enclose a portion of portable computer 270 and include mounting screw holes 286. PC board 12 may be secured to bottom case portion 19 using mounting screw holes 286. Case portions 16, 18 may enclose a portion of portable computer 270. An inner surface of case portion 16 may include thermally conductive element 284. A surface of processor 282 may include thermally conductive element 284. When case 280 is assembled to portable computer 270, thermally conductive element 284 provides a thermal conductivity path from a surface of processor 282 to the inner surface of case portion 16.

Power supplies 316 are sized and configured to be arranged perpendicular to interconnection mechanism 308 (when implemented as a backplane) or the bottom of case 304. Each power supply 316 may be hot swappable to allow for replacement of the power supply without requiring the power to be turned off to any of the components within case 304, e.g., portable devices 220, or other peripheral devices requiring power.

Power for the portable computing devices may come from one or more power supplies 316, an external power source (not shown), or a combination thereof. External sources of power may include, but is not limited to, an external DC source, such as 12 VDC power that comes from a vehicle or external battery, or an external AC source such as 110 VAC or 220 VAC. In the appropriate circumstances, a power conversion unit 279 can be included so as to convert the external or internal power source into the appropriate power supply inputs (e.g. 5 VDC or 3.3 VDC) for powering portable devices 220 and other peripheral components such as, but not limited to, an LCD screen/interface 372 or keyboard 376 within case 304 or connected to the case via a cable or wireless communication.

In order to conserve the use of power provided by power supplies 316 (when implemented as batteries) and extend the operating time of DDC 300 while operating under this type of power, portable devices 220 are configured to vary the voltage needs and clock frequencies to the CPU units and supporting computing/memory devices within the portable device as a function of the instantaneous demands for computing MIPS, memory access speeds, and interfacing communication speeds. For example, as the computation, memory access and interface requirements demand of DDC 300 increases, portable devices 220 contained therein will increase the power supply voltage and/or the clock speed independently in order to meet the demands. Concomitantly, as the computation, memory access and interface requirements decrease, the power supply voltage and/or the clock speed independently decrease while using the optimal amount of power (from power supplies 316 or external power supplies (when used/available)) required to meet those demands. One of the benefits of this approach is that it not only conserves power supply 316 power but also reduces the total heat dissipation of DDC 300.

A DDC, such as DDC 300, according to the present disclosure has multiple functions including computing, data storage and retrieval, communications and routing. The DDC may be deployed as a local cloud storage, serving and computing device which may operate with or without internet access. The functions available in the DDC include the ability to act as a computer cluster. Multiple CPU cores on each portable device 220 and multiple computing devices can be used in conjunction to solve complex computing tasks. Single complex tasks may be assigned multiple computing resources in parallel and managed by middleware. High fault tolerance is also achieved in the cluster computing mode. For example, if any one of the CPUs, portable devices 220 or readers 312 fail, the task can be performed by another module (i.e., reader, portable device, CPU combination) in the DDC. While each portable device 220 can include volatile and non-volatile mass storage, to increase the storage and retrieval capabilities the DDC may also have data memory storage drives (not shown) such as hard disk drives or flash memory physically separate from the portable devices. The size of the storage drives is expandable and configurable by the user. The storage devices may be located and mounted on interconnecting mechanism 308, a separate backplane, or in a bay accessed for the outside of case 304 through an access slot (not shown). The access slot may have a door which can be locked to physically secure the drives. Portable devices 220 can have secure access to the memory storage drives through interfaces including PCIe and DDR. The data on any of the storage drives may be accessed by any of portable devices 220 within the DDC. Each portable device 220 can also be configured such that the devices operate separate and independent of one another. This feature allows physical security and isolation between portable devices 220.

A user of a DDC, such as DDC 300, may interface with it through multiple inputs methods, such as, but not limited to a keyboard, a touchscreen, a mouse, a speech recognition device, and a gesture control device. Output devices suitable for use with DDC 300 include a display screen, a haptics device, and an audio device. A user interfacing with DDC 300 may require secure authentication and authorization. Authentication methods for DDC 300 can include password, fob token entry, and single or multimodal biometric authentication including fingerprint matching, face recognition, voice or iris scanning and matching.

Portable devices 220, readers 312, or other components within DDC 300 can include computer executable code capable of providing routing functions for data packets. The routing function within DDC 300 may enable interconnected networks to exchange information about destination address using a routing protocol. The routing function can be enabled for multiple types of physical networks including Ethernet and wireless networks. The routing function may also support multiple types of networking communications protocol standards including TCP, IPv4, IPv6.

In a first exemplary aspect a readily mobile deployable data center (DDC) is described that is capable of being transported by hand, the mobile DDC comprising a secure carrying case including a top portion and a bottom portion; at least one reader removably disposed within the bottom portion, wherein the at least one reader, when disposed in the bottom portion, provides a slot having at least one connector disposed therein; a portable computing device having a processor and removably coupled to the at least one connector, the portable computing device being disposed, then coupled to the at least one connecter, within the slot so as to have its major plane parallel to the major plane of the at least one reader: and at least one power supply removably disposed in the bottom portion and electronically coupled to the at least one reader and the portable computing device.

In another exemplary aspect, a readily mobile DDC comprises a hand held carrying case having a top portion and a bottom portion, wherein the bottom portion includes a plurality of interfaces extending through a sidewall of the bottom portion, and wherein when the top portion and the bottom portion are coupled together the hand held carrying case is impregnable by liquids and dust; a plurality of readers removably disposed within the bottom portion, wherein each of the plurality of readers are disposed with the bottom portion such that a slot is formed between adjacent ones of the plurality of readers; and a plurality of portable computing devices sized and configured to be removably coupled with a corresponding respective one of the plurality of readers within the slot formed between adjacent ones of the plurality of readers.

In yet another exemplary aspect, a method of preventing faults in a mobile data center is described, the method comprising providing a plurality of readers and a plurality of portable computing devices electronically coupled to corresponding respective ones of the plurality of readers, wherein each of the plurality of portable computing devices reside in a slot created by adjacent ones of the plurality of readers; selecting ones of the plurality of readers and/or plurality of portable computing devices to perform instructions related to computing functions; identifying ones of the plurality of readers and/or plurality of portable computing devices that are not adequately performing the instructions: and rerouting the instructions to other ones of the plurality of readers and/or plurality of portable computing devices that are capable of adequately performing the instructions based on the identifying.

Exemplary embodiments have been disclosed above and illustrated in the accompanying drawings. It will be understood by those skilled in the art that various changes, omissions, and additions may be made to that which is specifically disclosed herein without departing from the spirit and scope of the present disclosure.

Although the disclosure has been described in terms of exemplary embodiments, it is not limited thereto. Rather, the appended claims should be construed broadly to include other variants and embodiments of the disclosure which may be made by those skilled in the art without departing from the scope and range of equivalents of the disclosure.

The invention claimed is:

1. An apparatus, comprising:
   a portable computer having a processor, a thermally conductive element disposed on the processor, wherein the thermally conductive element comprises a dielectric layer having a rubbery texture that is configured to dissipate heat from the processor, a controller, at least two connectors, and at least one integrated circuit to store data and a control application; and
   a reader having an input port, an output port and at least mating two connectors, the reader having no user application processing central processing unit, the portable computer and the reader collectively having a first configuration and a second configuration, wherein:
   when in the first configuration:
   the portable computer and the reader are physically and operatively coupled together via the at least two connectors of the portable computer and the at least two mating connectors of the reader,
   the portable computer and the reader are disposed substantially parallel to one another,
   the portable computer is physically coupled to the reader via a plurality of screws,
   the portable computer excludes an input/output device,
   the input port and the output port of the reader provides access to the portable computer including access to the at least one integrated circuit of the portable computer, and
   the portable computer sending a control signal via the control application to the reader to control the reader, and
   when in the second configuration:
   the portable computer and the reader are not physically and operatively coupled together,
   the portable computer is not functional as a general purpose computer,
   the input port and the output port of the reader does not provide access to the portable computer including not providing access to the at least one integrated circuit of the portable computer,
   the reader is a non-functioning shell when the reader is not connected to the portable computer,
   a physical disconnection of the reader from the portable computer prevents access and power to the portable computer, thereby rendering the portable computer not functional as a general purpose computer, and
   the portable computer not sending the control signal to the reader and the reader not being controlled by the portable computer.

2. The apparatus of claim 1, wherein, when in the first configuration, the portable computer sends the control signal via the control application to control a peripheral of the reader.

3. The apparatus of claim 1, wherein:
   the control signal is a first control signal, and
   when in the first configuration:
   the portable computer sends the first control signal to the reader to generate a user interface at a display of the reader, the user interface receiving a plurality of user inputs that are sent to the portable computer via the control application, and the portable computer sends a second control signal based on the plurality of user inputs and via the control application, to control the reader.

4. The apparatus of claim 1, wherein:

the control signal is a first control signal, the control application is a first control application from a plurality of control applications stored at the at least one integrated circuit, and when in the first configuration,
the portable computer sends the first control signal via the first control application, and
the portable computer sends a second control signal via a second control application from the plurality of control applications.

5. The apparatus of claim 1, wherein:

the control signal is a first control signal, the control application is a first control application from a plurality of control applications stored at the at least one integrated circuit, and when in the first configuration:
the portable computer sends, via the first control application, the first control signal to the reader to generate a user interface at a display of the reader,
the portable computer sends, via a second control application from the plurality of control applications, a second control signal to the reader to control a peripheral of the reader.

6. The apparatus of claim 1, wherein the portable computer includes a primary memory and a secondary memory, the primary memory includes the at least one integrated circuit and readable by the processor, the secondary memory not readable by the processor.

7. The apparatus of claim 1, wherein the portable computer includes a primary memory and a secondary memory, the primary memory includes the at least one integrated circuit and readable by the processor, the primary memory being non-removable from the portable computer, the secondary memory not readable by the processor.

8. A method, comprising:

providing access to a portable computer including access to at least one integrated circuit of the portable computer via an input port and an output port of a reader when the portable computer and the reader are collectively in a first configuration defined by the portable computer and the reader being physically and operatively coupled together via at least two connectors of the portable computer and at least two mating connectors of the reader, the portable computer and the reader are disposed substantially parallel to one another, the portable computer is physically coupled to the reader via a plurality of screws, the reader having no user application processing central processing unit, the portable computer having a processor and a thermally conductive element disposed on the processor, wherein the thermally conductive element comprises a dielectric layer having a rubbery texture that is configured to dissipate heat from the processor, and excluding an input/output device;

sending, from the portable computer, a control signal via a control application of the portable computer to the reader to control the reader while in the first configuration;

disallowing access to the portable computer including disallowing access to the at least one integrated circuit of the portable computer when the portable computer and the reader are collectively in a second configuration defined by the portable computer and the reader not being physically and operatively coupled together, the portable computer not functioning as a general purpose computer while in the second configuration;

disallowing the control signal being sent from the portable computer to the reader while in the second configuration; and disallowing control of the reader while in the second configuration.

9. The method of claim 8, wherein sending, from the portable computer, the control signal includes sending from the portable computer the control signal via the control application to control a peripheral of the reader.

10. The method of claim 8, wherein the control signal is a first control signal, the portable computer sends the first control signal to the reader to generate a user interface at a display of the reader, while in the first configuration, the method further comprising:

receiving, via the user interface, a plurality of user inputs that are sent to the portable computer via the control application, and sending, via the portable computer, a second control signal based on the plurality of user inputs and via the control application, to control the reader.

11. The method of claim 8, wherein the control signal is a first control signal, the control application is a first control application from a plurality of control applications stored at the at least one integrated circuit, the portable computer sending the first control signal via the first control application while in the first configuration, the method further comprising:

sending, from the portable computer, a second control signal via a second control application from the plurality of control applications while in the first configuration.

12. The method of claim 8, wherein the control signal is a first control signal, the control application is a first control application from a plurality of control applications stored at the at least one integrated circuit, the portable computer sends, via the first control application, the first control signal to the reader to generate a user interface at a display of the reader while in the first configuration, the method further comprising:

sending, from the portable computer and via a second control application from the plurality of control applications, a second control signal to the reader to control a peripheral of the reader.

13. The method of claim 8, wherein the portable computer includes a primary memory and a secondary memory, the primary memory includes the at least one integrated circuit, the method further comprising:

reading, by the processor, the primary memory; and
disallowing the processor to read the secondary memory.

14. The method of claim 8, wherein the portable computer includes a primary memory and a secondary memory, the primary memory includes the at least one integrated circuit and readable by the processor, the primary memory being non-removable from the portable computer, the method further comprising:

reading, by the processor, the primary memory; and
disallowing the processor to read the secondary memory.

15. A method, comprising:

providing access to a portable computer including access to at least one integrated circuit of the portable computer via an input port and an output port of a reader when the portable computer and the reader are collectively in a first configuration defined by the portable computer and the reader being physically and operatively coupled together via at least two connectors of the portable computer and at least two mating connectors of the reader, the portable computer and the reader are disposed substantially parallel to one another, the portable computer is physically coupled to the reader via a plurality of screws, the reader having no user application processing central processing unit, the portable computer having a processor and a thermally conductive element disposed on the processor, wherein the thermally conductive element comprises a dielectric layer having a rubbery texture that is configured to dissipate heat from the processor, and excluding an input/output device;

sending, from the portable computer, a control signal via a control application of the portable computer to the reader to control the reader while in the first configuration;

the portable computer not being accessible by the reader including the at least one integrated circuit of the portable computer not being accessible by the reader when the portable computer and the reader are collectively in a second configuration defined by the portable computer and the reader not being physically and operatively coupled together, the portable computer not functioning as a general purpose computer while in the second configuration;

the control signal not being sent from the portable computer to the reader while in the second configuration; and the reader not being controlled by the portable computer while in the second configuration.

16. The method of claim 15, wherein sending, from the portable computer, the control signal while in the first configuration includes sending from the portable computer the control signal via the control application to control a peripheral of the reader.

17. The method of claim 15, wherein the control signal is a first control signal, the portable computer sends the first control signal to the reader to generate a user interface at a display of the reader, while in the first configuration, the method further comprising:

receiving, via the user interface, a plurality of user inputs that are sent to the portable computer via the control application, and sending, via the portable computer, a second control signal based on the plurality of user inputs and via the control application, to control the reader.

18. The method of claim 15, wherein the control signal is a first control signal, the control application is a first control application from a plurality of control applications stored at the at least one integrated circuit, the portable computer sending the first control signal via the first control application while in the first configuration, the method further comprising:

sending, from the portable computer, a second control signal via a second control application from the plurality of control applications while in the first configuration.

19. The method of claim 15, wherein the control signal is a first control signal, the control application is a first control application from a plurality of control applications stored at the at least one integrated circuit, the portable computer sends, via the first control application, the first control signal to the reader to generate a user interface at a display of the reader while in the first configuration, the method further comprising:

sending, from the portable computer and via a second control application from the plurality of control applications, a second control signal to the reader to control a peripheral of the reader.

20. The method of claim 15, wherein the portable computer includes a primary memory and a secondary memory, the primary memory includes the at least one integrated circuit, the method further comprising:

reading, by the processor, the primary memory, the secondary memory not accessible by the processor.

* * * * *